US012772578B2

(12) United States Patent
Hu et al.

(10) Patent No.: US 12,772,578 B2
(45) Date of Patent: Oct. 20, 2026

(54) AVALANCHE PHOTODETECTOR AND PREPARATION METHOD THEREFOR

(71) Applicant: WUHAN OPTICAL VALLEY INFORMATION OPTOELECTRONICS INNOVATION CENTER CO., LTD., Wuhan (CN)

(72) Inventors: Xiao Hu, Wuhan (CN); Daigao Chen, Wuhan (CN); Yuguang Zhang, Wuhan (CN); Lei Wang, Wuhan (CN); Xi Xiao, Wuhan (CN)

(73) Assignee: WUHAN OPTICAL VALLEY INFORMATION OPTOELECTRONICS INNOVATION CENTER CO., LTD., Wuhan (CN)

( * ) Notice: Subject to any disclaimer, the term of this patent is extended or adjusted under 35 U.S.C. 154(b) by 336 days.

(21) Appl. No.: 18/716,537

(22) PCT Filed: Dec. 23, 2022

(86) PCT No.: PCT/CN2022/141400

§ 371 (c)(1),
(2) Date: Jun. 5, 2024

(87) PCT Pub. No.: WO2023/125283

PCT Pub. Date: Jul. 6, 2023

(65) Prior Publication Data

US 2025/0048750 A1 Feb. 6, 2025

(30) Foreign Application Priority Data

Dec. 29, 2021 (CN) ......................... 202111633301.4
Dec. 29, 2021 (CN) ......................... 202111633446.4
Dec. 29, 2021 (CN) ......................... 202111643459.X

(51) Int. Cl.
*H10F 30/225* (2025.01)
*H10F 71/00* (2025.01)
(Continued)

(52) U.S. Cl.
CPC ........... *H10F 30/225* (2025.01); *H10F 71/00* (2025.01); *H10F 77/1223* (2025.01); *H10F 77/1243* (2025.01); *H10F 77/413* (2025.01)

(58) Field of Classification Search
CPC . H10F 30/225; H10F 77/1223; H10F 77/1243
See application file for complete search history.

(56) References Cited

U.S. PATENT DOCUMENTS 8,461,624 B2 6/2013 Na
8,723,221 B2 5/2014 Na
(Continued)

FOREIGN PATENT DOCUMENTS

CN 201885758 U 6/2011
CN 103262264 A * 8/2013 ........... H10F 77/122
(Continued)

OTHER PUBLICATIONS

Li, Lateral separate absorption charge multiplication Ge-on-Si avalanche photodiode with low dark current in linear mode, 2022 (Year: 2022).*

(Continued)

*Primary Examiner* — Britt Hanley
*Assistant Examiner* — Casey Paul Boatman
(74) *Attorney, Agent, or Firm* — Cooper Legal Group, LLC

(57) ABSTRACT

The present disclosure provides an avalanche photodetector and a preparation method therefor. The avalanche photodetector comprises: a substrate, the surface of which comprises a first semiconductor layer; and a second semiconductor layer located on the substrate, wherein the first semiconduc- (Continued)

tor layer comprises a first P-type doped region, a second P-type doped region, a third N-type doped region, a first intrinsic region, a third P-type doped region, a second intrinsic region, a second N-type doped region and a first N-type doped region which are sequentially arranged in a first direction, the dopant concentrations of the first to third P-type doped regions are sequentially decreased, the dopant concentrations of the first to third N-type doped regions are sequentially decreased, and the first direction is an electron flow direction; the second semiconductor layer sequentially covers part of the second P-type doped region, the third N-type doped region, the first intrinsic region and the third P-type doped region in the first direction; the first N-type doped region is connected to a first electrode; the third P-type doped region is connected to a second electrode; and the first N-type doped region is connected to a third electrode.

20 Claims, 16 Drawing Sheets

(51) Int. Cl.

| | |
|---|---|
| ***H10F 77/1223*** | (2025.01) |
| ***H10F 77/124*** | (2025.01) |
| ***H10F 77/40*** | (2025.01) |

(56) References Cited

U.S. PATENT DOCUMENTS

| | | | |
|---|---|---|---|
| 2012/0126286 | A1 | 5/2012 | Na |
| 2014/0077327 | A1 | 3/2014 | Na |
| 2016/0204298 | A1 | 7/2016 | Chen et al. |
| 2019/0229227 | A1 | 7/2019 | Samani et al. |
| 2019/0378949 | A1 | 12/2019 | Simoyama |
| 2020/0393618 | A1 | 12/2020 | Novack et al. |

FOREIGN PATENT DOCUMENTS

| | | | | |
|---|---|---|---|---|
| CN | 105428353 | A | | 3/2016 |
| CN | 105576072 | A | | 5/2016 |
| CN | 111933742 | A | | 11/2020 |
| CN | 112018211 | A | | 12/2020 |
| CN | 112331744 | A | | 2/2021 |
| CN | 113270507 | A | | 8/2021 |
| CN | 113707751 | A | | 11/2021 |
| CN | 114256374 | A | | 3/2022 |
| CN | 114256375 | A | | 3/2022 |
| CN | 114256376 | A | | 3/2022 |
| DE | 3921028 | A1 | | 1/1991 |
| JP | S5994474 | A | | 5/1984 |
| JP | H07312442 | A | | 11/1995 |
| JP | 2008305954 | A | | 12/2008 |
| JP | 6793786 | B1 | | 12/2020 |
| JP | 2021009892 | A | * | 1/2021 |
| WO | 2017023301 | A1 | | 2/2017 |
| WO | 2021038768 | A1 | | 3/2021 |

OTHER PUBLICATIONS

International Search Report in the international application No. PCT/CN2022/141400, mailed on Feb. 27, 2023, 3 pages.
English translation of the Written Opinion of the International Search Authority in the international application No. PCT/CN2022/141400, mailed on Feb. 27, 2023, 5 pages.

* cited by examiner

AVALANCHE PHOTODETECTOR AND PREPARATION METHOD THEREFOR

CROSS-REFERENCE TO RELATED APPLICATIONS

This application is filed based on and claims priority to Chinese Patent applications No. 202111643459.X, No. 202111633301.4 and No. 202111633446.4 which are filed on Dec. 29, 2021, the contents of which are hereby incorporated by reference in their entireties.

TECHNICAL FIELD

Embodiments of the disclosure relate to, but are not limited to, an avalanche photodetector and a method for preparing same.

BACKGROUND

As one of core components in a silicon photon architecture, an avalanche photodetector has a function of converting optical signals into electrical signals with a low power. A working principle of the avalanche photodetector is that photo-generated carriers (hole-electron pairs) generated by a photoelectric effect are rapidly accelerated when moving in a high electric field region. One or more collisions may occur during the movement. Through a collision ionization effect, secondary and tertiary new hole-electron pairs are generated, resulting in an avalanche multiplication effect, which makes the number of carriers increase rapidly, thus forming a relatively large optical signal current.

At present, germanium silicon (SiGe) materials compatible with a complementary metal oxide semiconductor (CMOS) process are widely used in a silicon photonic integrated chip to realize avalanche photodetection. A silicon material is used as an optical waveguide and also as an avalanche gain region (also referred to as a multiplication region), and a germanium (Ge) material is used to absorb photons. At present, the structure of the SiGe avalanche photodetector has following disadvantages. Firstly, an epistaxis process of monocrystalline silicon is required, which is complex in manufacturing. Secondly, an absorption region is usually P-type doped or N-type doped, which will cause light absorption loss and then reduce a quantum efficiency of the avalanche photodetector. Thirdly, the absorption region and the multiplication region are not easily adjustable independently, have a high precision requirement for concentrations in doped regions, and have a low process tolerance, which may easily lead to an unsatisfactory gain bandwidth. Therefore, the avalanche photodetector with SiGe materials needs further improvements.

SUMMARY

In an aspect, embodiments of the disclosure provide an avalanche photodetector, including: a substrate, a surface of the substrate including a first semiconductor layer; and a second semiconductor layer on the first semiconductor layer, a material of the second semiconductor layer being different from a material of the first semiconductor layer. Here, the first semiconductor layer includes a first P-type doped region, a second P-type doped region, a third N-type doped region, a first intrinsic region, a third P-type doped region, a second intrinsic region, a second N-type doped region, and a first N-type doped region arranged sequentially along a first direction, dopant concentrations decrease sequentially from the first P-type doped region to the third P-type doped region, dopant concentration decrease sequentially from the first N-type doped region to the third N-type doped region, and the first direction is a flow direction of electrons of the avalanche photodetector. The second semiconductor layer covers a portion of the second P-type doped region, the third N-type doped region, the first intrinsic region, and a portion of the third P-type doped region sequentially along the first direction. The first N-type doped region is connected to a first electrode; the third P-type doped region is connected to a second electrode; and the first P-type doped region is connected to a third electrode.

In some embodiments, the first intrinsic region, the third N-type doped region, a portion of the second P-type doped region adjacent to the third N-type doped region, and a portion of the third P-type doped region adjacent to the first intrinsic region in the first semiconductor layer have a first height $H_1$ in a direction perpendicular to the substrate, and remaining zones in the first semiconductor layer have a second height $H_2$. $H_1$ is not equal to $H_2$. The second semiconductor layer covers a portion of a zone of the second P-type doped region with the second height $H_2$, a zone of the second P-type doped region with the first height $H_1$, the third N-type doped region, the first intrinsic region, a zone of the third P-type doped region with the first height $H_1$, and a portion of a zone of the third P-type doped region with the second height $H_2$ sequentially along the first direction.

In some embodiments, $H_1$ is greater than $H_2$.

In some embodiments, $H_1$ is smaller than $H_2$.

In some embodiments, the avalanche photodetector further includes: an optical waveguide located on the first semiconductor layer, and including a front end close to a light incidence end and a tail end away from the light incidence end. A third height $H_3$ of a portion of the second P-type doped region adjacent to the first P-type doped region in the first semiconductor layer is smaller than a fourth height $H_4$ of remaining zones in the first semiconductor layer, to form a groove extending along a second direction, and the second direction is perpendicular to the first direction and is parallel to the surface of the substrate. The second semiconductor layer covers a portion of a zone the second P-type doped region with the fourth height $H_4$, the third N-type doped region, the first intrinsic region, and a portion of the third P-type doped region sequentially along the first direction. The optical waveguide is located in the groove, and is arranged to extend roughly along the second direction and form a predetermined included angle with the second direction, to enable the front end to be close to the first P-type doped region and to enable the tail end to be close to the second P-type doped region with the fourth height $H_4$.

In some embodiments, the optical waveguide is undoped or lightly doped.

In some embodiments, a first reverse bias voltage $V_1$ is set between the first electrode and the third electrode, and a second reverse bias voltage $V_2$ is set between the first electrode and the second electrode.

In some embodiments, the material of the first semiconductor layer is silicon, and the material of the second semiconductor layer is germanium, germanium silicon alloy, a III-V group material, and an alloy of the III-V group material.

In some embodiments, a dopant concentration in the first P-type doped region or the first N-type doped region is $1\times10^{20}/cm^3 \sim 5\times10^{20}/cm^3$, a dopant concentration in the second P-type doped region or the second N-type doped region is $2\times10^{17}/cm^3 \sim 5\times10^{18}/cm^3$, and a dopant concentration in the third P-type doped region or the third N-type doped region is $1.2\times10^{17}$~$4\times10^{17}$/cm$^3$.

In some embodiments, a size of the second intrinsic region in the first direction is 50 nm to 800 nm.

In some embodiments, a size of the second semiconductor layer in the first direction is 150 nm to 1500 nm, a size of the second semiconductor layer in a second direction is 1 μm to 100 μm, and a size of the second semiconductor layer in a third direction is 150 nm to 600 nm. The third direction is perpendicular to the substrate, and the second direction is perpendicular to the third direction and is perpendicular to the first direction.

Embodiments of the disclosure further provide a method for preparing an avalanche photodetector, including the following operations. A substrate is provided. A surface of the substrate includes a first semiconductor layer. A selective doping process is performed, to form a first P-type doped region, a second P-type doped region, a third N-type doped region, a first intrinsic region, a third P-type doped region, a second intrinsic region, a second N-type doped region, and a first N-type doped region sequentially along a first direction on the first semiconductor layer, dopant concentration decrease sequentially from the first P-type doped region to the third P-type doped region, and dopant concentrations decrease sequentially from the first N-type doped region to the third N-type doped region. A second semiconductor layer is formed. A material of the second semiconductor layer is different from a material of the first semiconductor layer, and the second semiconductor layer covers a portion of the second P-type doped region, the third N-type doped region, the first intrinsic region, and a portion of the third P-type doped region sequentially along the first direction. A first electrode, a second electrode and a third electrode that are perpendicular to a direction of a plane of the substrate are formed. The first electrode is electrically connected to the first N-type doped region. The second electrode is electrically connected to the third P-type doped region. The third electrode is electrically connected to the first P-type doped region. The first direction is a flow direction of electrons of the avalanche photodetector.

In some embodiments, the method further includes the following operation. Before performing the selective doping process, in zones where a portion of the second P-type doped region, a portion of the third P-type doped region, the first intrinsic region and the third N-type doped region are to be formed, in a direction perpendicular to the substrate, a height different from a height of remaining zones in the first semiconductor layer in the direction perpendicular to the substrate is formed.

In some embodiments, the operation that before performing the selective doping process, in the zones where the portion of the second P-type doped region, the portion of the third P-type doped region, the first intrinsic region and the third N-type doped region are to be formed, in the direction perpendicular to the substrate, the height different from the height of the remaining zones in the first semiconductor layer in the direction perpendicular to the substrate is formed includes the following operation. In the zones where the portion of the second P-type doped region, the portion of the third P-type doped region, the first intrinsic region and the third N-type doped region are to be formed, in the direction perpendicular to the substrate, a height $H_1$ greater than a height $H_2$ of the remaining zones in the first semiconductor layer in the direction perpendicular to the substrate is formed.

In some embodiments, the operation that before performing the selective doping process, in the zones where the portion of the second P-type doped region, the portion of the third P-type doped region, the first intrinsic region and the third N-type doped region are to be formed, in the direction perpendicular to the substrate, the height different from the height of the remaining zones in the first semiconductor layer in the direction perpendicular to the substrate is formed includes the following operation. In the zones where the portion of the second P-type doped region, the portion of the third P-type doped region, the first intrinsic region and the third N-type doped region are to be formed, in the direction perpendicular to the substrate, a height $H_1$ smaller than a height $H_2$ of the remaining zones in the first semiconductor layer in the direction perpendicular to the substrate is formed.

In some embodiments, the method further includes the following operation. Before performing the selective doping process, two wedge-shaped grooves are formed on zones where a portion of the second P-type doped region adjacent to the first P-type doped region is to be formed, to reserve a portion of the first semiconductor layer between the two wedge-shaped grooves.

In some embodiments, the portion of the first semiconductor layer reserved is undoped or lightly doped.

In some embodiments, the material of the first semiconductor layer is silicon, and the material of the second semiconductor layer is germanium, germanium silicon alloy, a III-V group material and an alloy of the III-V group material.

In some embodiments, a dopant concentration in the first P-type doped region or the first N-type doped region is $1\times10^{20}$/cm$^3$~$5\times10^{20}$/cm$^3$, a dopant concentration in the second P-type doped region or the second N-type doped region is $2\times10^{17}$/cm$^3$~$5\times10^{18}$/cm$^3$, and a dopant concentration in the third P-type doped region or the third N-type doped region is $1.2\times10^{17}$~$4\times10^{17}$/cm$^3$.

In some embodiments, the operation that the first electrode, the second electrode and the third electrode that are perpendicular to the direction of the plane of the substrate are formed includes the following operations. A cover layer covering the first semiconductor layer and the second semiconductor layer is formed. A first window, a second window and a third window are formed at an end of the first N-type doped region, an end of the third P-type doped region and an end of the first P-type doped region respectively along a second direction, to expose partial surfaces of the first P-type doped region, the third P-type doped region and the first N-type doped region. The second direction is perpendicular to the first direction and is parallel to the substrate. The first window, the second window and the third window are filled with metal, to form the first electrode, the second electrode and the third electrode.

BRIEF DESCRIPTION OF THE DRAWINGS

One or more embodiments are described in an exemplary way with corresponding figures in the drawings, which do not constitute a limitation to the one or more embodiments, and the figures in the drawings do not constitute a limitation in scale unless specifically stated.

DETAILED DESCRIPTION

Figure 1:
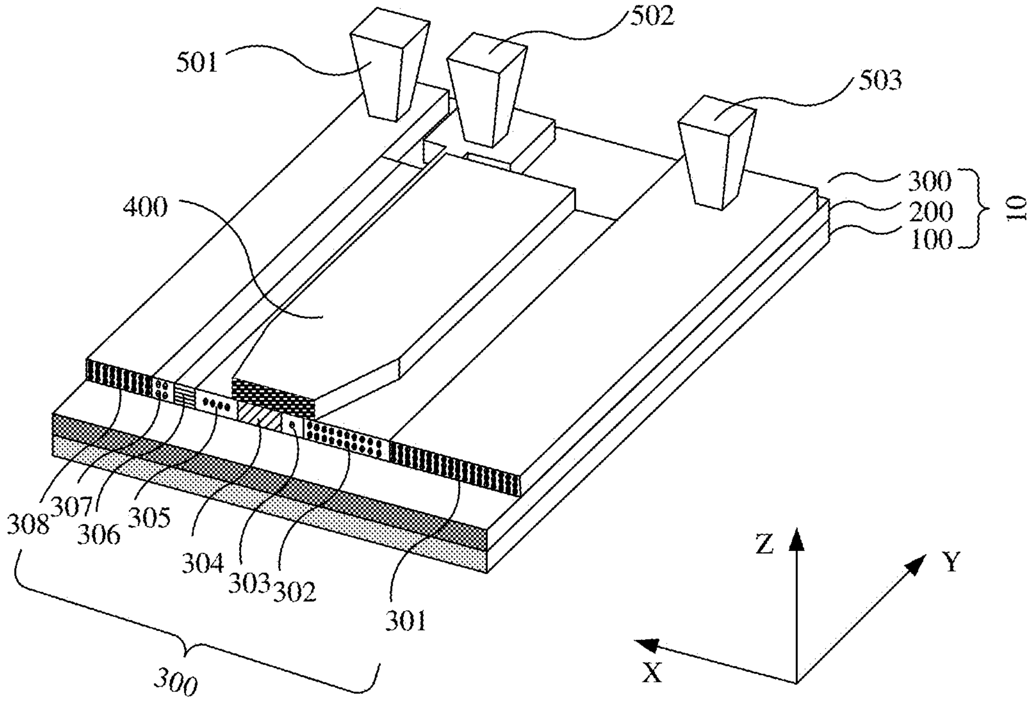
FIGS. 1 to 3 illustrate schematic structural diagrams of an avalanche photodetector according to embodiments of the disclosure.

In order to make the technical solution and advantages of embodiments of the disclosure clearer, the technical solution of the disclosure is further described in detail below in combination with the drawings and particular embodiments.

In the embodiments of the disclosure, terms “first”, “second” and the like are used to distinguish similar objects, but are not used to describe a particular order or sequence.

In the embodiments of the disclosure, unless expressly specified and limited otherwise, an “on” or “below” relationship between two layers in a semiconductor structure may be a direct contact between the two layers, or an indirect contact between the two layers through an intermediate layer.

In the embodiments of the disclosure, a term “layer” refers to a material portion including a region with a thickness. The layer may extend on the entirety of an upper or lower structure, or may have a range smaller than that of the lower or upper structure. Further, the layer may be a region of a homogeneous or heterogeneous continuous structure with a thickness smaller than a thickness of a continuous structure. For example, the layer may be located between top and bottom surfaces of the continuous structure, or the layer may be located between any horizontal plane pairs at the top and bottom surfaces of the continuous structure. The layer may extend horizontally, vertically, and/or along an inclined surface. Further, the layer may include multiple sub-layers.

In the embodiments of the disclosure, spatial relative terms such as “under”, “below”, “down”, “above”, “on”, “upward”, “downward” and the like may describe a relationship between (among) an element or feature and another (multiple) element(s) or feature(s) for ease of description in the disclosure, as shown in the drawings. The spatial relative terms aim to encompass different orientations of a component in use or operation, other than those depicted in the drawings. A device may be oriented in other ways (rotated by 90 degrees or in other orientations), and spatial relative descriptors used in the disclosure may be used to interpret the orientations accordingly.

Silicon (Si) photon technology is a new generation technology based on Si and a silicon substrate material (e.g., SiGe/Si, silicon-on-insulator (SOI), etc.), which uses an existing CMOS process to develop and integrate optical devices. The silicon photon technology combines characteristics of ultra-large scale and ultra-high precision manufacturing of an integrated circuit technology with advantages of ultra-high speed and ultra-low power consumption of a photon technology, which is a disruptive technology to address a failure of Moore’s Law. This combination benefits from the scalability of semiconductor wafer manufacturing, and thus reducing costs. As one of core components in a silicon photon architecture, photodetectors have a function of converting optical signals into electrical signals. At present, a structure of a SiGe avalanche photodetector has following disadvantages. Firstly, an epistaxis process of monocrystalline silicon is required, which is complex in manufacturing. Secondly, an absorption region is usually P-type doped or N-type doped, which will cause light absorption loss and then reduce a quantum efficiency of the avalanche photodetector. Thirdly, the absorption region and the avalanche region (also referred to as a multiplication region) are not easily adjustable independently, have a high precision requirement for concentrations in doped regions, and have a low process tolerance, which may easily lead to an unsatisfactory gain bandwidth.

Based on this, the following technical solution in embodiments of the disclosure is proposed.

Embodiments of the disclosure provide an avalanche photodetector, including: a substrate, a surface of the substrate including a first semiconductor layer; and a second semiconductor layer on the first semiconductor layer, a material of the second semiconductor layer being different from a material of the first semiconductor layer.

Here, the first semiconductor layer includes a first P-type doped region, a second P-type doped region, a third N-type doped region, a first intrinsic region, a third P-type doped region, a second intrinsic region, a second N-type doped region, and a first N-type doped region arranged sequentially along a first direction. Dopant concentrations decrease sequentially from the first P-type doped region to the third P-type doped region. Dopant concentrations decrease sequentially from the first N-type doped region to the third N-type doped region. The first direction is a flow direction of electrons of the avalanche photodetector.

The second semiconductor layer covers a portion of the second P-type doped region, the third N-type doped region, the first intrinsic region, and a portion of the third P-type doped region sequentially along the first direction.

The first N-type doped region is connected to a first electrode. The third P-type doped region is connected to a second electrode. The first P-type doped region is connected to a third electrode.

Figure 2:
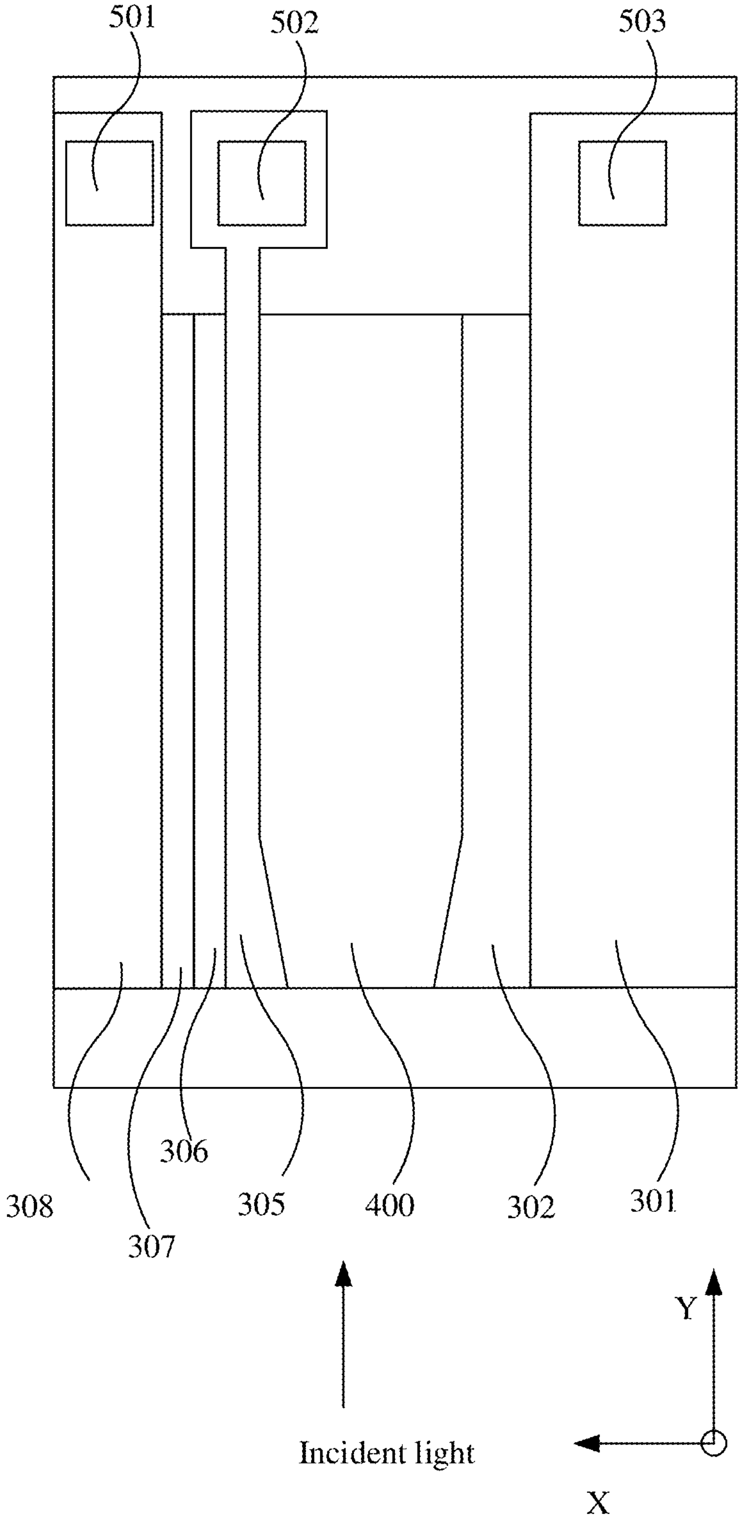
Figure 3:
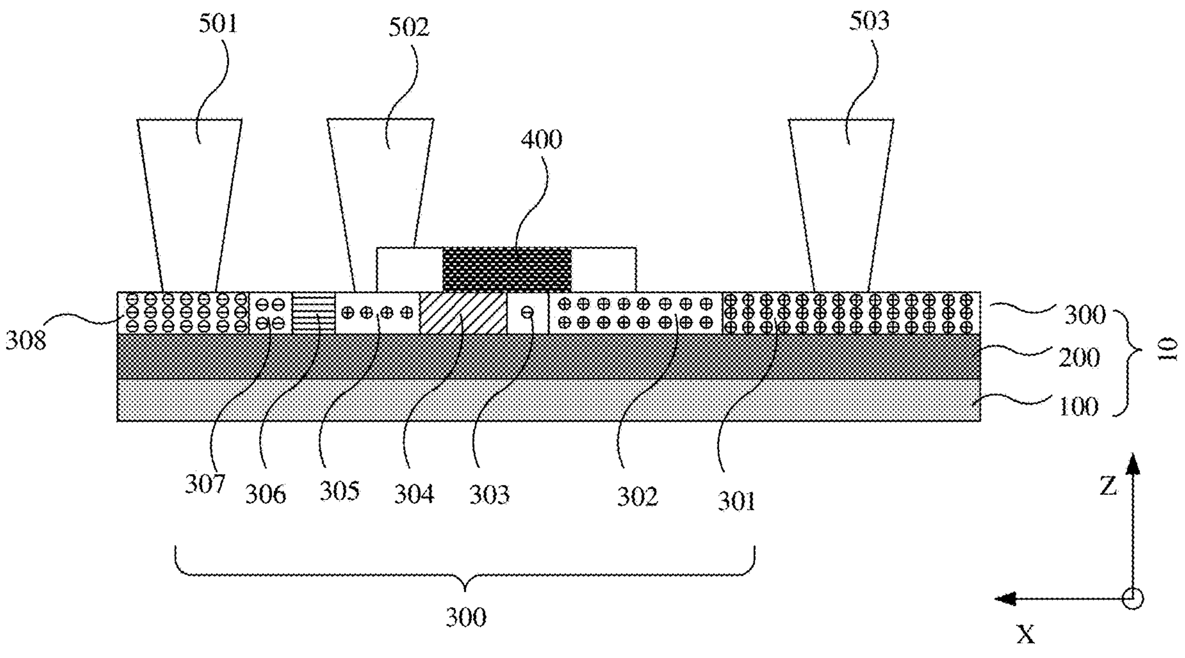

Please refer specifically to FIGS. 1 to 3. Here, FIG. 1 illustrates a schematic axonometric view of an avalanche photodetector provided according to embodiments of the disclosure. FIG. 2 illustrates a schematic top view of the avalanche photodetector according to embodiments of the disclosure. FIG. 3 illustrates a schematic diagram of the avalanche photodetector along a Y direction according to embodiments of the disclosure.

With reference to FIGS. 1 to 3, the avalanche photodetector includes a substrate 10 and a second semiconductor layer 400.

The substrate 10 includes a first semiconductor layer 300. An avalanche region of the avalanche photodetector is formed in the first semiconductor layer 300 to realize an avalanche effect.

The second semiconductor layer 400 is formed of a material different from a material of the first semiconductor layer 300.

A layout of each part of the avalanche photodetector of the disclosure is described in detail below.

Here, the substrate may have a multilayer structure. A top of the substrate is a first semiconductor layer. Under the first semiconductor layer, the substrate may include a layer composed of a monoatomic semiconductor material (e.g., Si, and Ge), a composite semiconductor material (e.g., SiGe), and an insulating layer composed of oxides of the monoatomic semiconductor material and the composite semiconductor material. In the embodiment, the substrate 10 may be such as SOI or germanium-on-insulator (GeOI).

The embodiment of the disclosure is described with a layer below the surface of the substrate being SOI as an example. It may be understood that the first semiconductor layer 300 is located at the top of the substrate 10 in the disclosure.

In some embodiments, the material of the first semiconductor layer 300 includes Si. Layers below the first semiconductor layer 300 include an insulating layer 200 and a bottom layer 100 sequentially.

In practical applications, the bottom layer 100 may be a Si wafer or a wafer formed by other materials. Therefore, a material of the bottom layer 100 may be Si, Ge, sapphire or the like.

In some embodiments, the material of the bottom layer 100 is Si, and correspondingly, a material of the insulating layer 200 may be an oxide of Si, such as Si dioxide.

The bottom layer 100 may have a greater thickness than the first semiconductor layer 300. It should be understood that in order to make the structure of each layer clearly shown in the drawings, a dimensional scale relationship of structures in the layers may be inconsistent with actual structures.

It should be noted that, for ease of description, as illustrated in FIG. 1, the embodiment of the disclosure is described by means of a first direction (X), a second direction (Y) and a third direction (Z) (see FIG. 1).

Here, the substrate 10 may include a top surface at a front side and a bottom surface at a back side opposite to the front side; and a direction perpendicular to the top and bottom surfaces of the substrate is defined as the third direction (Z) in a case of ignoring the flatness of the top and bottom surfaces. The third direction Z is a stacking direction of depositing the structure of each layer on the substrate, or is referred to as a height direction of components. A plane where the top and bottom surfaces of the substrate are located, or a central plane in a thickness direction of the substrate in a strict sense is determined as a plane of the substrate. The first direction (X) and the second direction (Y) intersecting each other (e.g., perpendicular to each other) are defined in a direction of the plane of the substrate. In the embodiment, the first direction X is a flow direction of electrons; and the second direction Y is a propagation direction of optical signals.

In theory, any semiconductor material may be used as a material of the first semiconductor layer 300 in the avalanche photodetector, thus the material of the first semiconductor is not strictly limited herein. In the embodiment where the substrate 10 includes a monoatomic Si bottom layer 100, the material of the first semiconductor is Si.

In order to realize an avalanche effect in the avalanche photodetector, different regions formed in the first semiconductor layer 300 of the avalanche photodetector include differently doped regions, including regions doped with different concentrations of P-type dopants and N-type dopants, and undoped regions (intrinsic regions).

A structure of the first semiconductor layer 300 of the avalanche photodetector according to embodiments of the disclosure is described in detail below. In some embodiments, the first semiconductor layer 300 in the avalanche photodetector includes a first P-type doped region 301, a second P-type doped region 302, a third N-type doped region 303, a first intrinsic region 304, a third P-type doped region 305, a second intrinsic region 306, a second N-type doped region 307, and a first N-type doped region 308 arranged sequentially along the first direction. Dopant concentrations of the first P-type doped region, the second P-type doped region, and the third P-type doped region decrease sequentially, and dopant concentrations of the first N-type doped region, the second N-type doped region, and the third N-type doped region decrease sequentially.

In some embodiments, the first intrinsic region, the third N-type doped region, a portion of the second P-type doped region adjacent to the third N-type doped region, and a portion of the third P-type doped region adjacent to the first intrinsic region in the first semiconductor layer have a first height $H_1$ in a direction perpendicular to the substrate, and remaining zones in the first semiconductor layer have a second height $H_2$. $H_1$ is not equal to $H_2$.

The second semiconductor layer covers a portion of a zone of the second P-type doped region with the second height $H_2$, a zone of the second P-type doped region with the first height $H_1$, the third N-type doped region, the first intrinsic region, a zone of the third P-type doped region with the first height $H_1$, and a portion of a zone of the third P-type doped region with the second height $H_2$ sequentially along the first direction.

Figure 4:
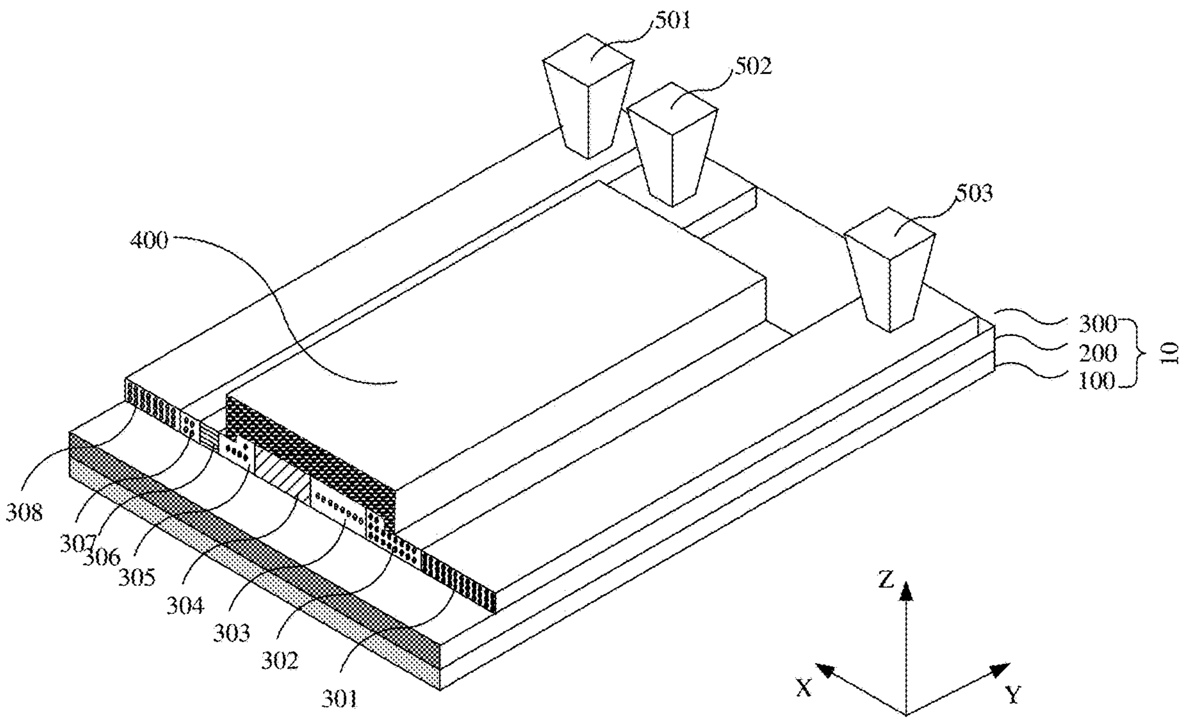
FIGS. 4 to 6 illustrate schematic structural diagrams of another avalanche photodetector according to embodiments of the disclosure.
Figure 5:
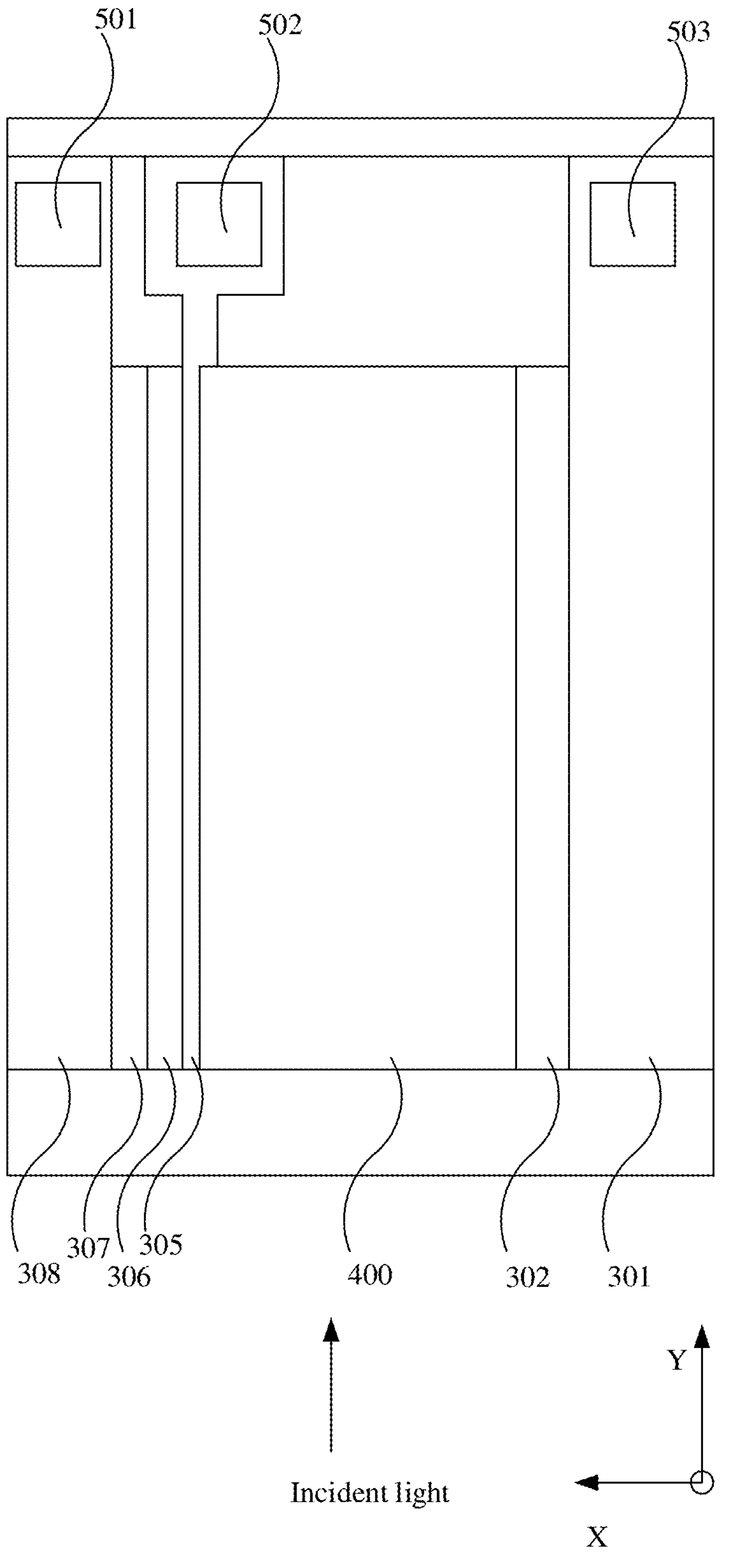
Figure 6:
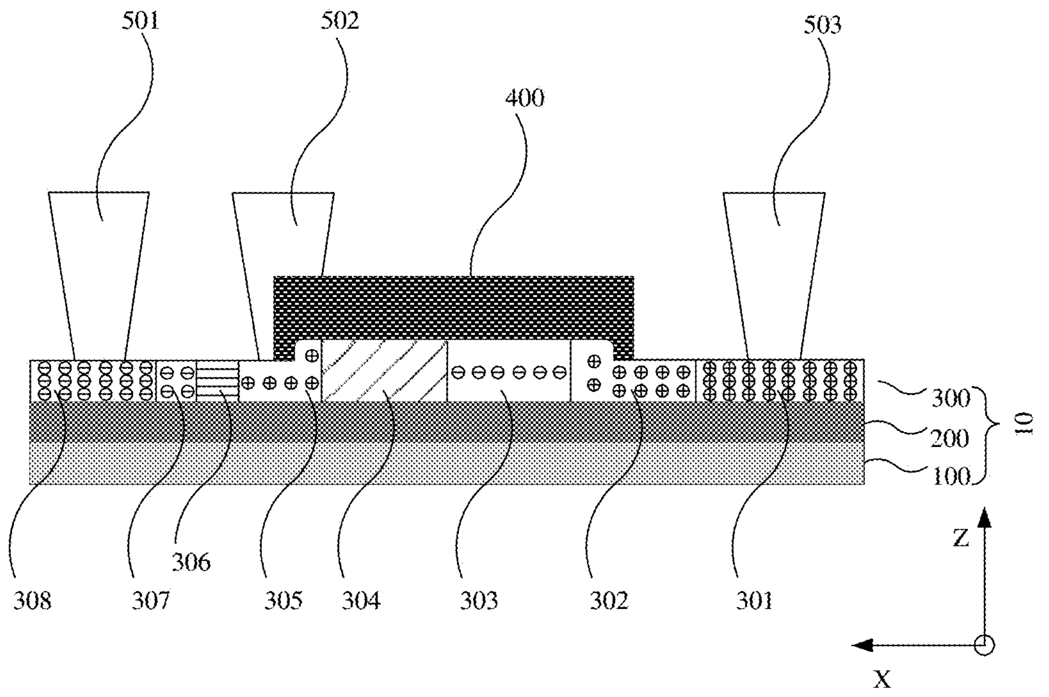

FIGS. 4 to 6 illustrate schematic diagrams of another avalanche photodetector according to embodiments of the disclosure. Here, FIG. 4 illustrates a schematic axonometric view, FIG. 5 illustrates a schematic top view, and FIG. 6 illustrates a schematic diagram along a Y direction.

In some embodiments, the height $H_1$ of the portion of the second P-type doped region, the portion of the third P-type doped region, the first intrinsic region, and the third N-type doped region in the first semiconductor layer in the direction perpendicular to the substrate is greater than the height $H_2$ of the remaining zones in the first semiconductor layer.

In this case, combined with FIGS. 4 and 6, the height $H_1$ of the portion of the second P-type doped region 302, the portion of a third P-type doped region 305, the first intrinsic region 304, and the third N-type doped region 303 in the first semiconductor layer 300 in the direction (direction Z) perpendicular to the substrate is greater than the height $H_2$ of the remaining zones in the first semiconductor layer.

It may be understood that, compared to the remaining zones in the first semiconductor layer, the portion of the second P-type doped region 302, the portion of the third P-type doped region 305, the first intrinsic region 304, and the third N-type doped region 303 are protruding. From a perspective of the Y direction, the portion of the second P-type doped region 302, the portion of the third P-type doped region 305, the first intrinsic region 304, and the third N-type doped region 303 form an inverted U shape.

Figure 7:
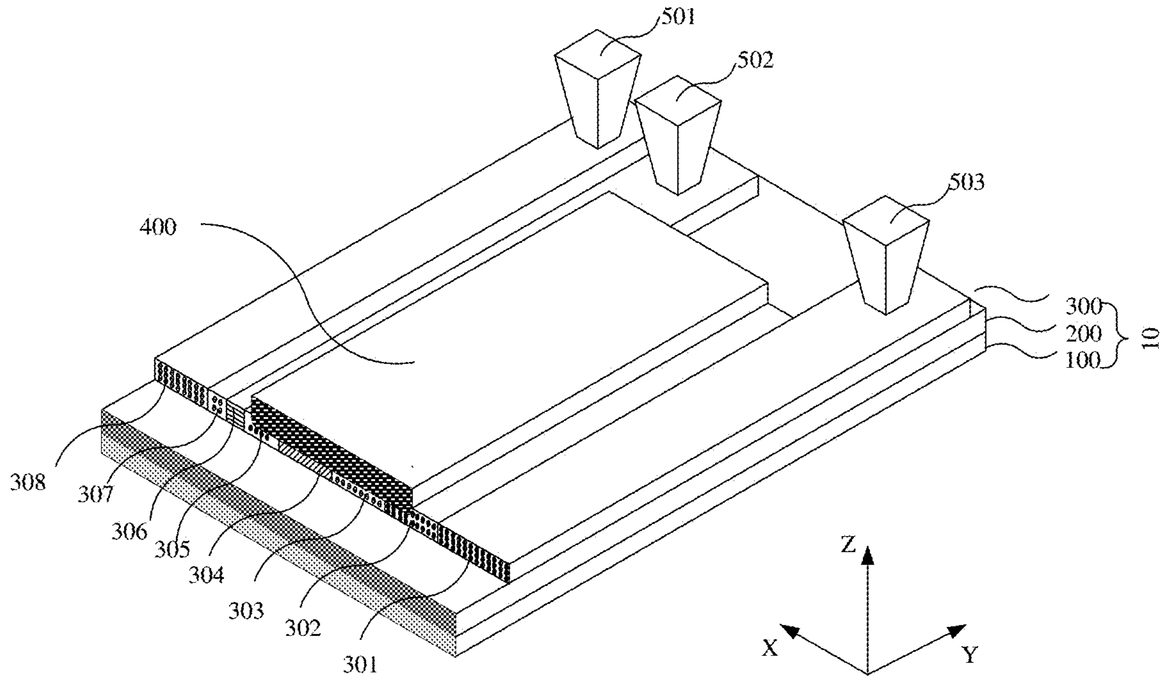
FIGS. 7 to 9 illustrate schematic structural diagrams of yet another avalanche photodetector according to embodiments of the disclosure.
Figure 8:
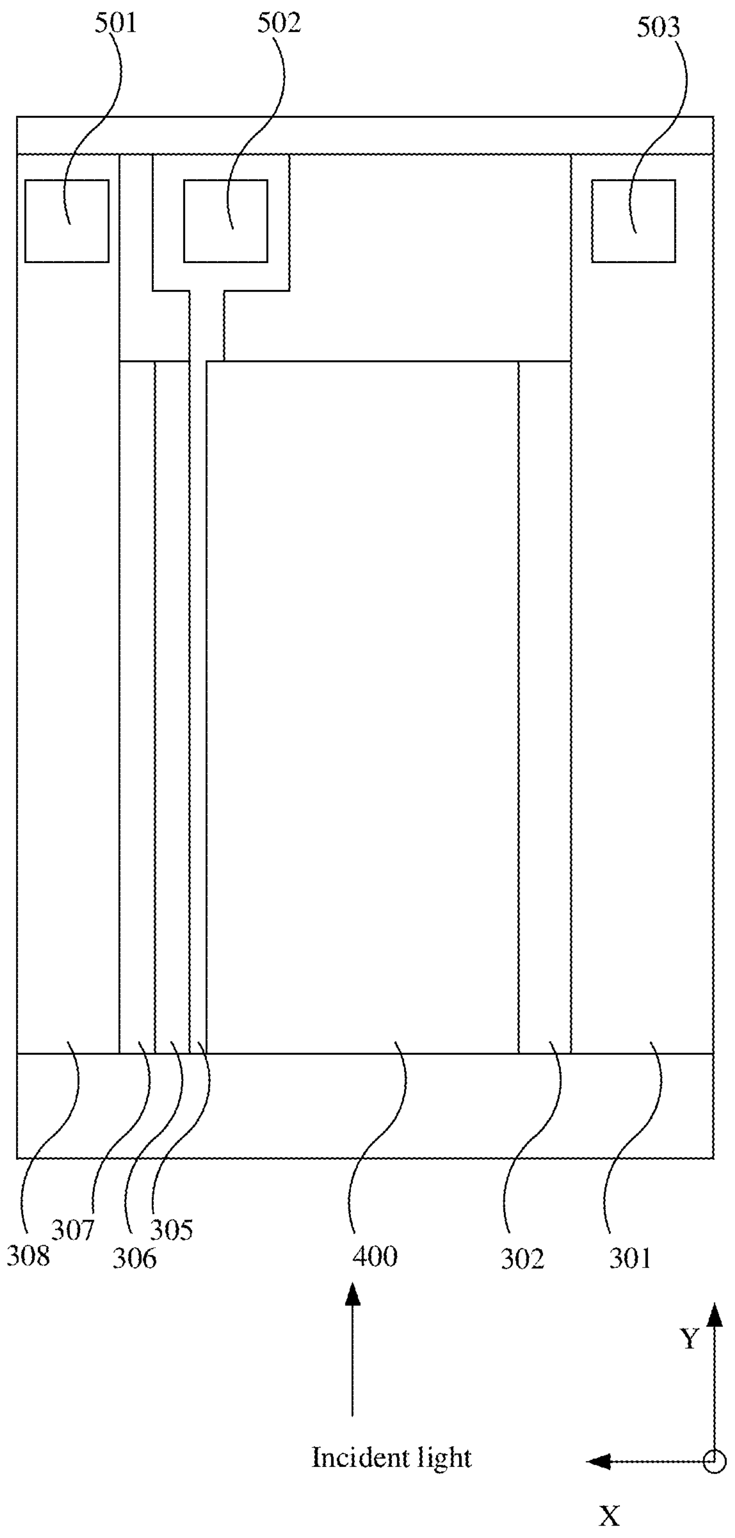
Figure 9:
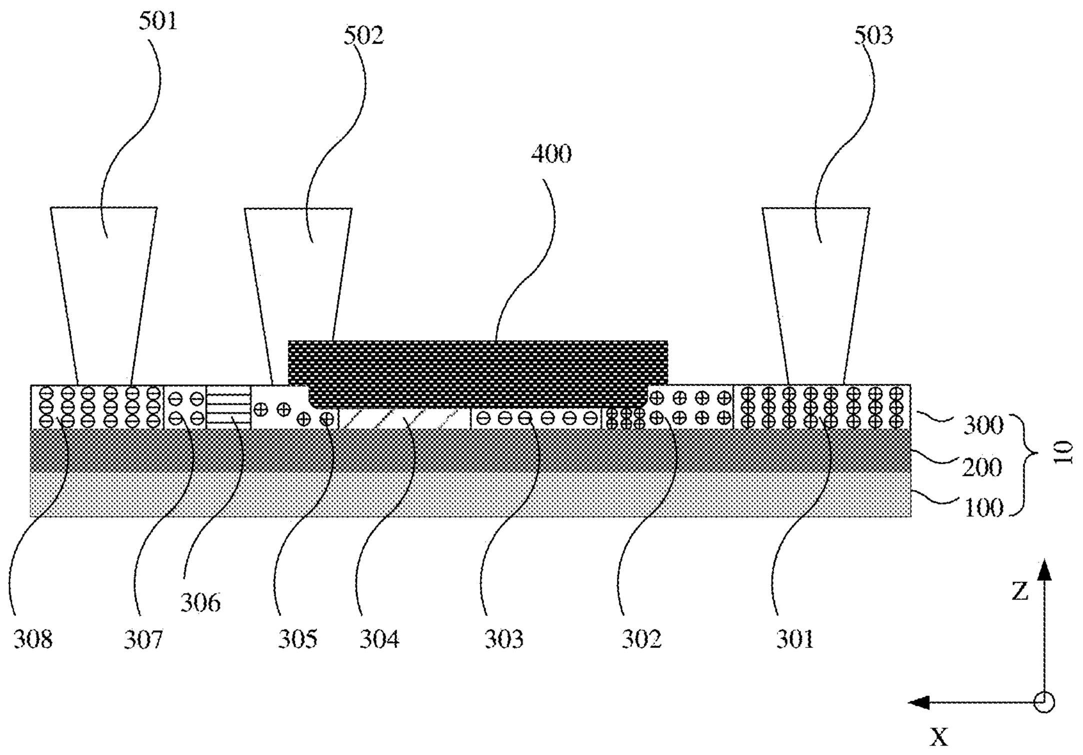

FIGS. 7 to 9 illustrate schematic diagrams of yet another avalanche photodetector according to embodiments of the disclosure. Here, FIG. 7 illustrates a schematic axonometric view, FIG. 8 illustrates a schematic top view, and FIG. 9 illustrates a schematic diagram along a Y direction.

In some embodiments, as illustrated in FIGS. 7 to 9, the height $H_1$ of the portion of the second P-type doped region, the portion of the third P-type doped region, the first intrinsic region, the third N-type doped region in the first semiconductor layer in the direction perpendicular to the substrate is smaller than the height $H_2$ of the remaining zones in the first semiconductor layer.

In this case, combined with FIGS. 7 and 9, the height $H_1$ of the portion of the second P-type doped region 302, the portion of the third P-type doped region 305, the first intrinsic region 304, and the third N-type doped region 303 in the first semiconductor layer 300 in the direction (direction Z) perpendicular to the substrate is smaller than the height $H_2$ of the remaining zones in the first semiconductor layer 300.

It may be understood that, compared to the remaining zones in the first semiconductor layer 300, the portion of the second P-type doped region 302, the portion of the third P-type doped region 305, the first intrinsic region 304, and the third N-type doped region 303 are concave. From a perspective of the Y direction, the portion of the second P-type doped region 302, the portion of the third P-type doped region 305, the first intrinsic region 304, and the third N-type doped region 303 have a U shape.

In some embodiments, the avalanche photodetector further includes an optical waveguide.

The optical waveguide is located on the first semiconductor layer, and includes a front end close to a light incidence end and a tail end away from the light incidence end.

A third height $H_3$ of a portion of the second P-type doped region adjacent to the first P-type doped region in the first semiconductor layer is smaller than a fourth height $H_4$ of remaining zones in the first semiconductor layer, to form a groove extending along a second direction, and the second direction is perpendicular to the first direction and is parallel to the surface of the substrate.

The second semiconductor layer covers a portion of a zone the second P-type doped region with the fourth height $H_4$, the third N-type doped region, the first intrinsic region, and a portion of the third P-type doped region sequentially along the first direction.

The optical waveguide is located in the groove, and is arranged to extend roughly along the second direction and form a predetermined included angle with the second direction, to enable the front end to be close to the first P-type doped region and to enable the tail end to be close to the zone of the second P-type doped region with the fourth height $H_4$.

Figure 10:
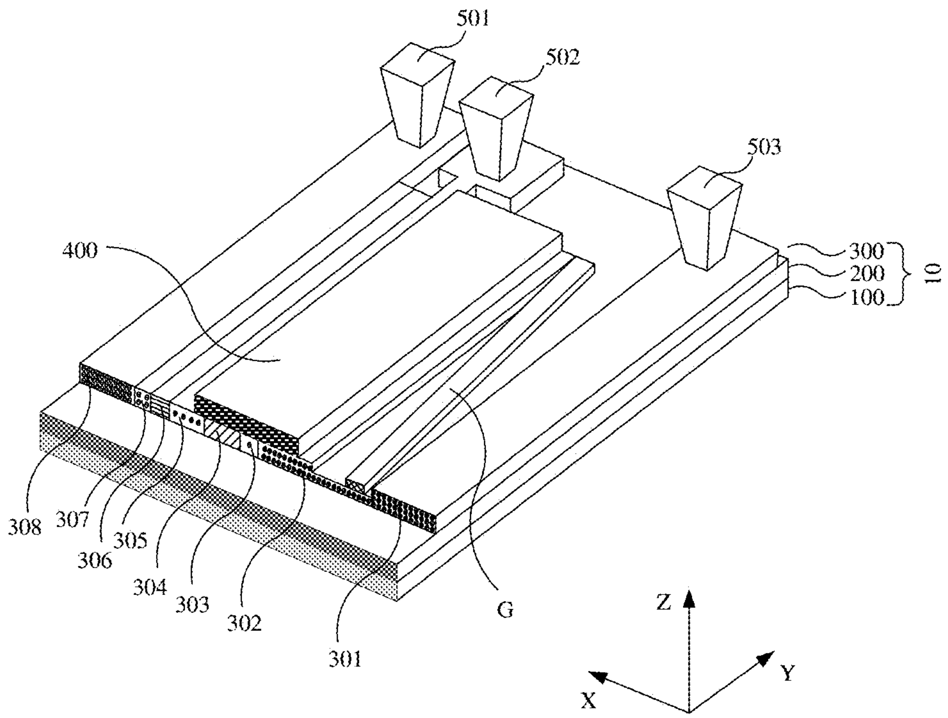
FIGS. 10 to 13 illustrate schematic structural diagrams of yet another avalanche photodetector according to embodiments of the disclosure.
Figure 11:
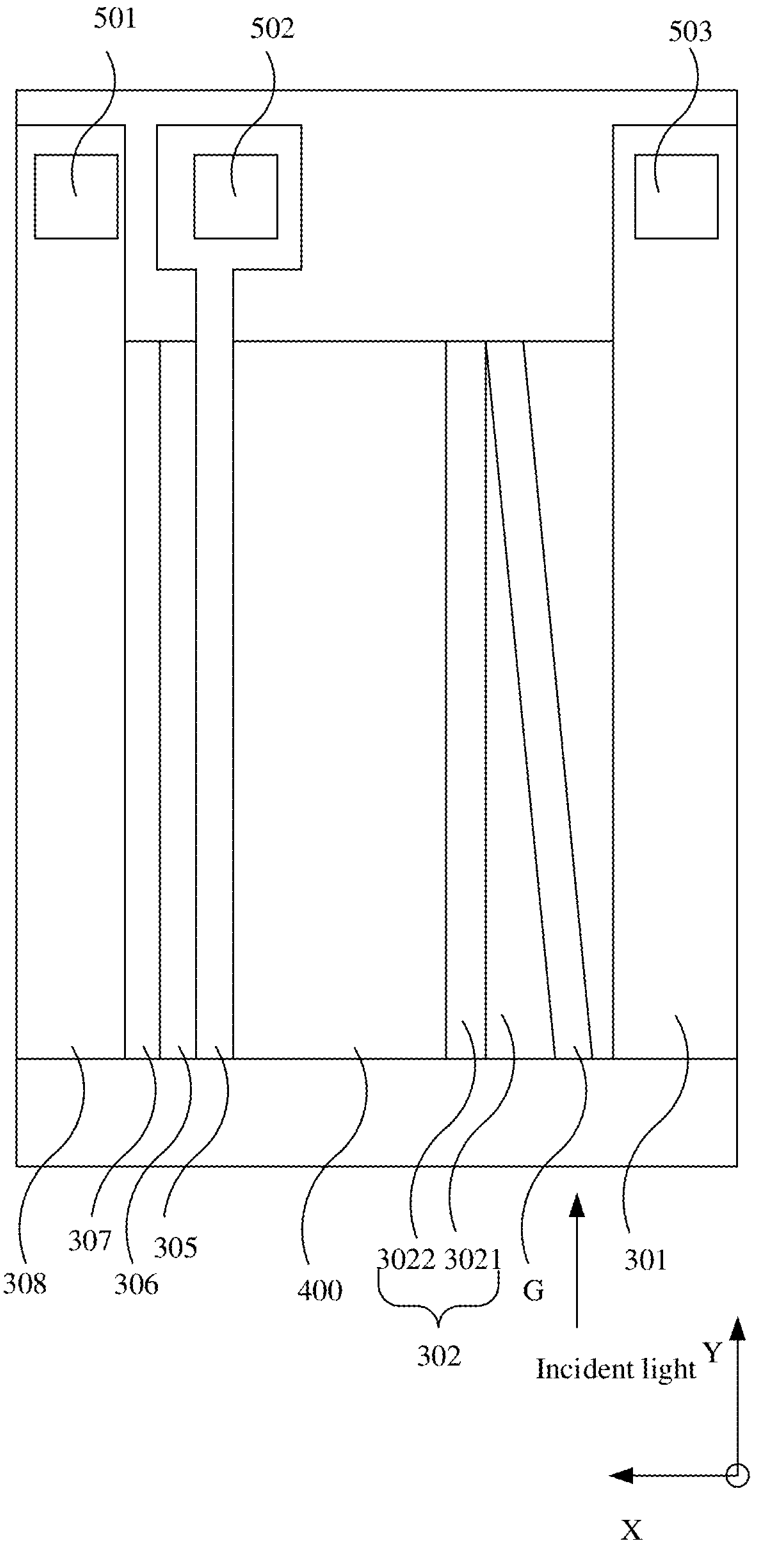
Figure 12:
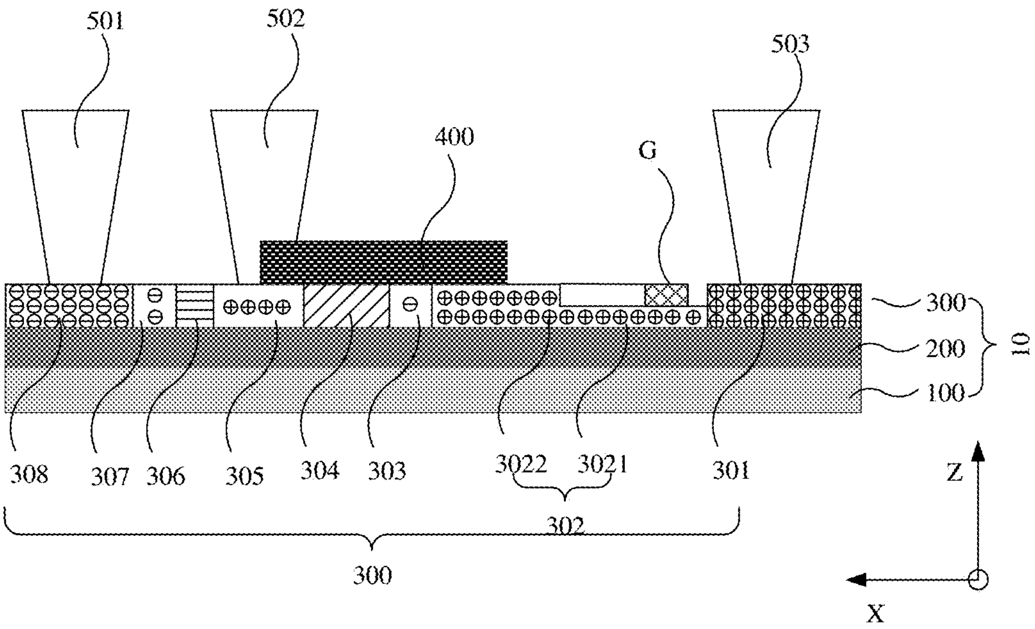
Figure 13:
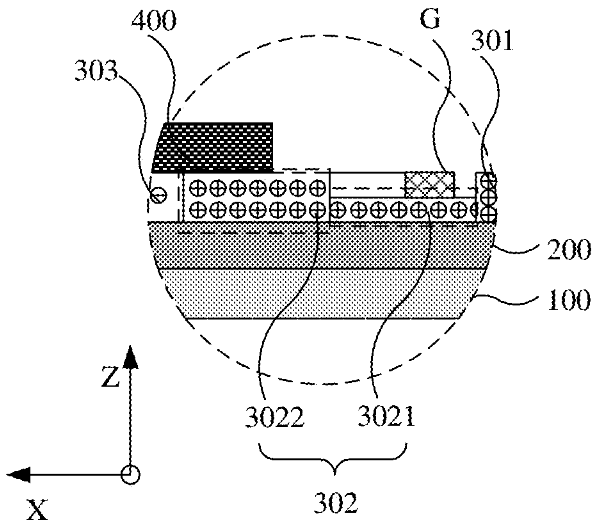

FIGS. 10 to 13 illustrate schematic diagrams of yet another avalanche photodetector according to embodiments of the disclosure. Here, FIG. 10 illustrates a schematic axonometric view, FIG. 11 illustrates a schematic top view, FIG. 12 illustrates a schematic diagram along a Y direction, and FIG. 13 illustrates a partially enlarged schematic diagram of FIG. 12.

In some embodiments, as illustrated in FIGS. 10 to 13, the avalanche photodetector further includes an optical waveguide G. The optical waveguide G is located on the first semiconductor layer 300, and the optical waveguide G includes the front end close to the light incidence end and the tail end away from the light incidence end.

A portion of the second P-type doped region 302 adjacent to the first P-type doped region 301 in a second direction (Y) has a groove. That is, the second P-type doped region 302 consists of two parts: a second P-type doped I region 3021 and a second P-type doped II region 3022. Reference may be made to FIGS. 11 to 13. Here, the second P-type doped I region 3021 is the groove, which has a height in a third direction (Z) smaller than a height of remaining regions in the first semiconductor layer 300. The remaining part of the second P-type doped region 302 is the second P-type doped II region 3022, which is adjacent to the third N-type doped region 303 and has a height flush with the remaining regions in the first semiconductor layer 300 in the third direction (Z). It should be noted that, the two portions of the second P-type doped region 302, i.e., the second P-type doped I region 3021 and the second P-type doped II region 3022, have the same dopant concentration as each other, and differ from each other only in their heights.

In some embodiments, the P-type dopant may be boron (B), and the N-type dopant may be phosphorus (P) or arsenic (As).

In some embodiments, a dopant concentration in the first P-type doped region 301 or the first N-type doped region 308 is $1\times10^{20}/cm^3\sim5\times10^{20}/cm^3$, a dopant concentration in the second P-type doped region 302 or the second N-type doped region 307 is $2\times10^{17}/cm^3\sim5\times10^{18}/cm^3$, and a dopant concentration in the third P-type doped region 305 or the third N-type doped region 303 is $1.2\times10^{17}\sim4\times10^{17}/cm^3$.

In practical applications, due to that intrinsic regions are undoped or lightly doped, dopant concentrations of the intrinsic regions are generally smaller than a predetermined value, for example, smaller than $1\times10^{17}/cm^3$.

It should be noted that dopant concentrations of the first P-type doped region and the first N-type doped region may be same or different, as long as the dopant concentrations are within the above range.

Similarly, dopant concentrations of the second P-type doped region and the second N-type doped region may be same or different, and dopant concentrations of the third P-type doped region and the third N-type doped region may be same or different.

The intrinsic regions may be an undoped or lightly doped first semiconductor material. Here, the intrinsic regions are regions where collision ionization occurs to produce electron-hole pairs.

In the first semiconductor layer 300 in the avalanche photodetector of the disclosure, an avalanche region may be the second intrinsic region 306.

It should be understood that the avalanche photodetector is based on that a voltage is applied to the avalanche region to produce an electric field, so as to extract photo-generated carriers by the electric field to form a current. Specifically, a bias voltage is applied between two sides of the avalanche region along the first direction to realize the photodetection.

In embodiments of the disclosure, a second semiconductor layer 400 is provided on the first semiconductor layer 300, and a material of the second semiconductor layer 400 is different from the material of the first semiconductor layer.

In some embodiments, the material of the first semiconductor layer is Si, and the material of the second semiconductor layer is one of Ge, SiGe alloy, a III-V group material, and an alloy of the III-V group material.

In further embodiments, the material of the first semiconductor layer 300 is Si, and the material of the second semiconductor layer is Ge. Therefore, an avalanche photodetector formed is a SiGe photodetector.

Here, due to that the second semiconductor layer 400 as an absorption region in the avalanche photodetector provided by the disclosure is not P-type doped or N-type doped and is not involved in Ohmic contact, light absorption loss can be reduced as much as possible, which is beneficial to improving a quantum absorption efficiency.

In the embodiment, the second semiconductor layer 400 of the avalanche photodetector covers a portion of the second P-type doped region 302, the third N-type doped region 303, the first intrinsic region 304, and a portion of the third P-type doped region 305 sequentially along the first direction. The second semiconductor layer 400 is formed as the absorption region of the avalanche photodetector.

In some embodiments, combining with FIGS. 4 and 6, the second semiconductor layer 400 of the avalanche photodetector of the disclosure covers a portion of the second P-type doped region 302, the third N-type doped region 303, the first intrinsic region 304, and a portion of the third P-type doped region 305 sequentially along the first direction X. In a case where the height $H_1$ of a portion of the second P-type doped region 302, a portion of the third P-type doped region 305, the first intrinsic region 304 and the third N-type doped region 303 in the first semiconductor layer 300 in the direction (direction Z) perpendicular to the substrate is greater than the height $H_2$ of the remaining zones in the first semiconductor layer, the second semiconductor layer 400 is spatially complementary with the regions of the first semiconductor layer. The second semiconductor layer 400 is formed as the absorption region of the avalanche photodetector.

In some embodiments, combining with FIGS. 7 and 9, the second semiconductor layer 400 of the avalanche photodetector of the embodiment covers a portion of the second P-type doped region 302, the third N-type doped region 303, the first intrinsic region 304, and a portion of the third P-type doped region 305 sequentially along the first direction X. In a case where the height $H_1$ of a portion of the second P-type doped region 302, a portion of the third P-type doped region 305, the first intrinsic region 304 and the third N-type doped region 303 in the first semiconductor layer 300 in the direction (direction Z) perpendicular to the substrate is smaller than the height $H_2$ of the remaining zones in the first semiconductor layer 300, the second semiconductor layer 400 is spatially complementary with the regions of the first semiconductor layer. The second semiconductor layer 400 is formed as the absorption region of the avalanche photodetector.

In the above two cases, due to that a portion of the second P-type doped region, a portion of the third P-type doped region, the first intrinsic region and the third N-type doped region have the height different from the height of the remaining zones in the first semiconductor layer in the direction perpendicular to the substrate, and the second semiconductor layer covers a portion of a zone of the second P-type doped region with the second height $H_2$, a zone of the second P-type doped region with the first height $H_1$, the third N-type doped region, the first intrinsic region, a zone of the third P-type doped region with the first height $H_1$, and a portion of a zone of the third P-type doped region with the second height $H_2$ sequentially along the first direction, the second semiconductor layer has a larger contact area with the second P-type doped region and the third P-type doped region, which can improve a transmission efficiency of electrons participating in the avalanche effect subsequently.

Besides, a portion of the second P-type doped region 302 that is not covered by the second semiconductor layer has a groove, and the optical waveguide G is provided in the groove. The optical waveguide G is located at a surface of the second P-type doped I region 3021, that is, in the groove of the second P-type doped region 302. Please refer to FIGS. 11 to 13. The optical waveguide G has a front end and a tail end, and is arranged to extend roughly along the second direction (Y) from the front end to the tail end. That is, a direction in which the optical waveguide G extends from the front end to the tail end have a predetermined included angle with the second direction (Y), such that the front end of the optical waveguide G is spaced from a front end of the second P-type doped II region 3022, and the tail end of the optical waveguide G is close to a tail end of the second P-type doped II region 3022. Here, the front end of the optical waveguide G is close to the first P-type doped region 301, and the tail end of the optical waveguide G is close to the portion of the zone of the second P-type doped region 302 with the fourth height $H_4$. Here, the "close to" means that two objects are in contact with each other, or that the two objects are separated by a small distance. In practical processes, the front end of the optical waveguide G is preferably spaced from the first P-type doped region 301 by a distance, e.g., 800 nm, to avoid an influence of the dopant in the first P-type doped region 301 on light in the optical waveguide. In practical processes, the tail end of the optical waveguide G is in contact with the portion of the zone of the second P-type doped region 302 with the fourth height $H_4$, thus the tail end of the optical waveguide G is close to the second semiconductor layer 400. Light is incident into the optical waveguide G along the Y direction and is then absorbed by the second semiconductor layer 400 through the second P-type doped II region 3022 of the second P-type doped region 302. Here, the second P-type doped II region 3022 not only acts as a channel for electron transmission, but also as a medium for propagating from the optical waveguide to the second semiconductor layer.

In some embodiments, the optical waveguide is undoped or lightly doped. Due to that the second P-type doped I region 3021 of the second P-type doped region 302 below the optical waveguide is P-type doped, ion implantation is physically blocked by the optical waveguide in practical processes. By setting appropriate doping conditions, P-type doping of the second P-type doped I region 3021 can be realized, while enabling the optical waveguide to be close to an intrinsic state.

By providing a separate optical waveguide G, incident light can be limited to propagate within the optical waveguide G, thus reducing the light propagation loss and improving the optical propagation efficiency. Further, the incident light passes through the optical waveguide G, then passes through the second P-type doped II region 3022 of the second P-type doped region 302, and then couples to the second semiconductor. This process is relatively slow and therefore relatively stable.

Here, when an optical signal is applied to the optical waveguide G of the avalanche photodetector, the optical waveguide G transfers the energy of the light to the second semiconductor layer 400 through the second P-type doped II region 3022 of the second P-type doped region 302. The second semiconductor layer 400 is capable of absorbing photons in the optical signal. According to Einstein's photoelectric effect, a photon produces a photo-generated electron. Therefore, the second semiconductor layer 400 absorbs photons and produces electrons which are photo-generated electrons.

Please refer to FIGS. 1 to 3, the second semiconductor layer 400 covers a portion of the second P-type doped region 302 and a portion of the third P-type doped region 305, thereby bridging the second P-type doped region 302 and the third P-type doped region 305 to form a carrier path. The photo-generated electrons can move from the second P-type doped region 302 to the third P-type doped region 305 under the action of the electric field.

Continuing with reference to FIGS. 1 to 3, the avalanche photodetector in the embodiment further includes a first electrode 501, a second electrode 502 and a third electrode 503. The first electrode 501 is electrically connected to the first N-type doped region 308, the second electrode 502 is electrically connected to the third P-type doped region 305, and the third electrode 503 is electrically connected to the first P-type doped region 301.

With the first electrode 501, the second electrode 502 and the third electrode 503 electrically connected to the first N-type doped region 308, the third P-type doped region 305 and the first P-type doped region 301 respectively, by providing a first bias voltage $V_1$ between the first electrode 501 and the third electrode 503, the first bias voltage $V_1$ can be provided between the first N-type doped region 308 and the first P-type doped region 301. Further, by providing a second bias voltage $V_2$ between the first electrode 501 and the second electrode 502, an additional second bias voltage $V_2$ can be provided between the first N-type doped region 308 and the third P-type doped region 305.

As described above, the second semiconductor layer 400 as the absorption region connects the second P-type doped region 302 and the third P-type doped region 305 to form the carrier path. Therefore, by applying the electric field (i.e., by the first bias voltage $V_1$) between the first N-type doped region 308 and the first P-type doped region 301, the energy of the photo-generated electrons above can be adjusted.

With regard to providing the second bias voltage $V_2$ between the third P-type doped region 305 and the first N-type doped region 308, as the third P-type doped region 305 and the first N-type doped region 308 are respectively located between two sides of the second intrinsic region 306 which serves as the avalanche region, the second bias voltage $V_2$ can regulate an electric field distribution in the avalanche region. The avalanche region of the avalanche photodetector refers to a region where carrier (electrons here) multiplication occurs, thus the avalanche region may also be referred to as a multiplication region. The absorption region of the avalanche photodetector can convert the incident optical signal into multiple electrons, and these electron pairs flow under the action of the electric field to form a photocurrent; the avalanche region can further excite a small number of electrons formed in the absorption region by the avalanche effect, to form a large number of electrons to realize amplification; and finally, a pair of metal electrodes conduct the photocurrent to realize the photodetection.

In the presence of the electric field (due to the first bias voltage $V_1$ applied to the avalanche photodetector), the photo-generated electrons are accelerated towards the second intrinsic region 306 for multiplication. When passing through the second intrinsic region 306, the photo-generated electrons collide with other carriers bound in semiconductor atomic lattices, thereby producing more free carriers by a process referred to as "collision ionization". These new free carriers are also accelerated by the applied electric field and more free carriers are produced.

Furthermore, in the embodiments of the disclosure, the arrangement of the third N-doped region 303, the first intrinsic region 304, and the third P-doped region 305 of the avalanche photodetector, and the concentration range of the dopants in the third N-doped region 303 and the third P-doped region 305 are beneficial to the electric field distribution in the second semiconductor layer 400 as the absorption region. Due to the existence of the first intrinsic region 304, electrons cannot pass through the first intrinsic region 304 even under the action of the first bias voltage $V_1$, and the first intrinsic region 304 acts as a barrier to a certain extent. Electrons from the second P-doped region 302 can pass through the third N-doped region 303, through the second semiconductor layer 400, and then through the third P-doped region 305 towards the avalanche region.

The existing avalanche photodetectors only apply a bias voltage between two sides of the avalanche region, which has some disadvantages. For example, the absorption region and the avalanche region (also referred to as a multiplication region) are not easily adjustable independently, have a high precision requirement for concentrations in doped regions, and have a low process tolerance, which may easily lead to an unsatisfactory gain bandwidth. Therefore, in order to realize the above avalanche effect, the disclosure proposes to set a bias voltage between two sides of the absorption region the avalanche photodetector and also set a bias voltage between two sides of the avalanche region of the avalanche photodetector, that is, the first bias voltage $V_1$ is provided between the first P-doped region 301 and the first N-doped region 308, and the second bias voltage $V_2$ is provided between the first N-doped region 308 and the third P-type doped region 305. Therefore, electric fields corresponding to the absorption region and the avalanche region can be independently adjusted, and the gain bandwidth can be further improved.

It should be noted that the first bias voltage $V_1$ and the second bias voltage $V_2$ are independent from each other. The first bias voltage $V_1$ acts on the absorption region, and a value of the first bias voltage $V_1$ may be 1 to 4 volts. The second bias voltage $V_2$ acts on the avalanche region, and a value of the second bias voltage $V_2$ may be 3 to 20 volts.

In some embodiments, a size of the second intrinsic region 306 in the first direction X is 50 nm to 800 nm, that is, a width of the second intrinsic region 306 is within the above range. Therefore, a large bandwidth is realized while a higher gain is realized. Since the second intrinsic region 306 is an avalanche region of the avalanche photodetector in the embodiments of the disclosure, the size of the second intrinsic region 306 in the first direction X should not be too small. For example, when the size of the second intrinsic region 306 in the first direction X is smaller than 50 nm, electrons moving from the absorption region to the second intrinsic region do not have sufficient avalanche space and thus cannot be absorbed effectively, and the multiplication effect is poor. The size of the second intrinsic region 306 in the first direction X should not be too large, otherwise the voltage required between two sides of the avalanche region is too high, the time for electrons to avalanche is too long, the response is reduced, and the detection effect is affected.

In some embodiments, a size of the second semiconductor layer in the first direction X is 150 nm to 1500 nm, a size of the second semiconductor layer in the second direction Y is 1 μm to 100 μm, and a size of the second semiconductor layer in the third direction Z is 150 nm to 600 nm. The size of the second semiconductor layer in the embodiments of the disclosure is limited within the above range, thus the generated dark current can reduced while the noise is reduced and.

Here, when describing the size of the second semiconductor layer, size differences between the upper and lower surfaces of the second semiconductor layer during the epistaxis process may not be considered.

It should be noted that a shape of the second semiconductor layer 400 in a plane parallel to the substrate 10 may be a regular rectangle, as illustrated in FIG. 4, FIG. 7 or FIG. 10, or may be a trapezoid with a certain size of chamfer along the first direction X, as illustrated in FIG. 1.

Figure 15A:
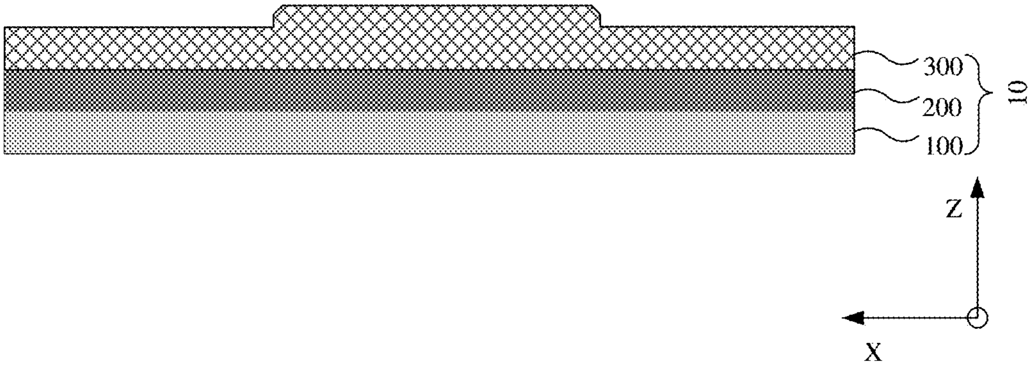
FIGS. 15A to 15E illustrate cutaway views of component structures of an avalanche photodetector during preparation according to embodiments of the disclosure.
Figure 15B:
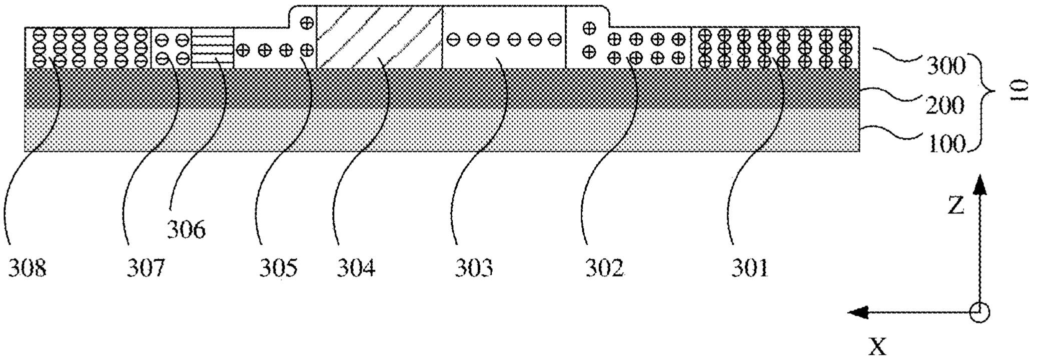
Figure 15C:
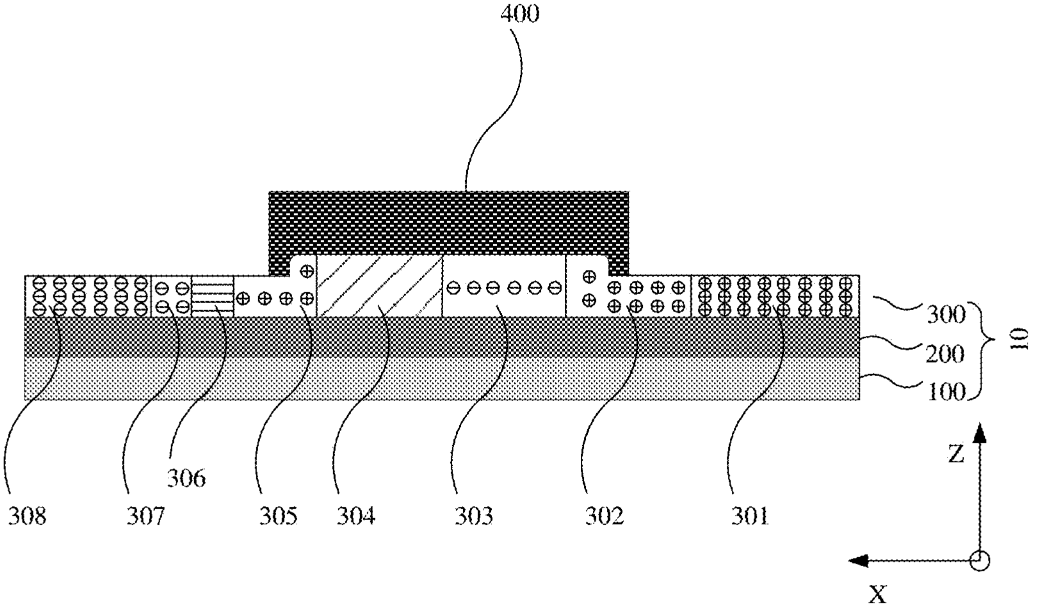
Figure 15D:
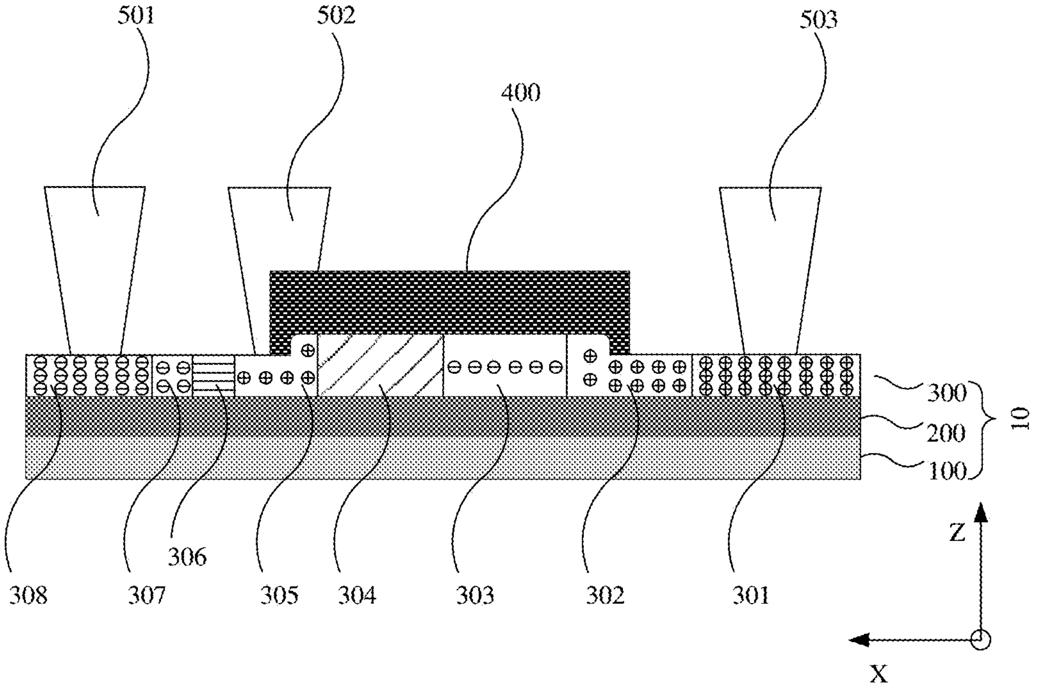
Figure 15E:
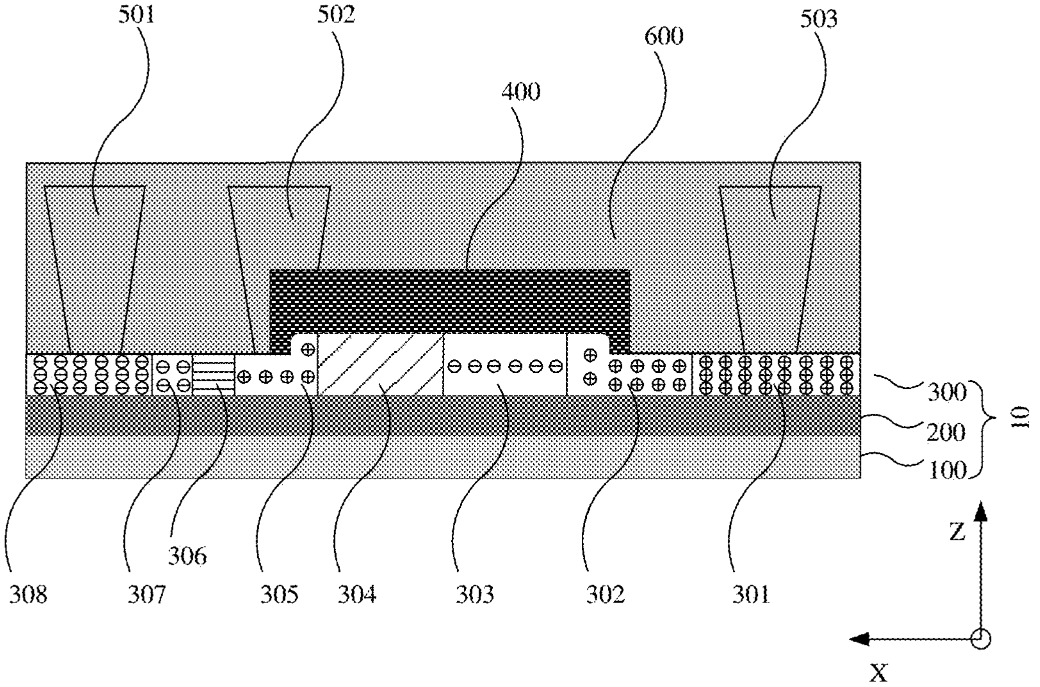
Figure 16A:
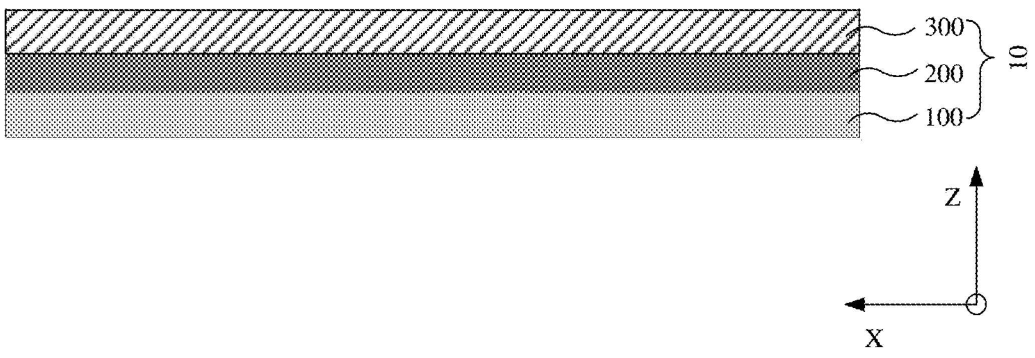
FIGS. 16A to 16G illustrate cutaway views of component structures of another avalanche photodetector during preparation according to embodiments of the disclosure.
Figure 16B:
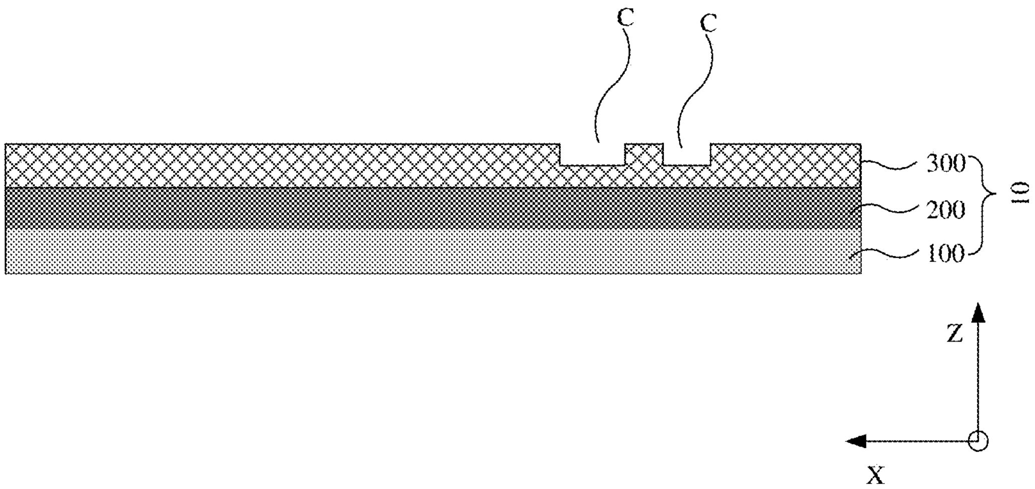
Figure 16C:
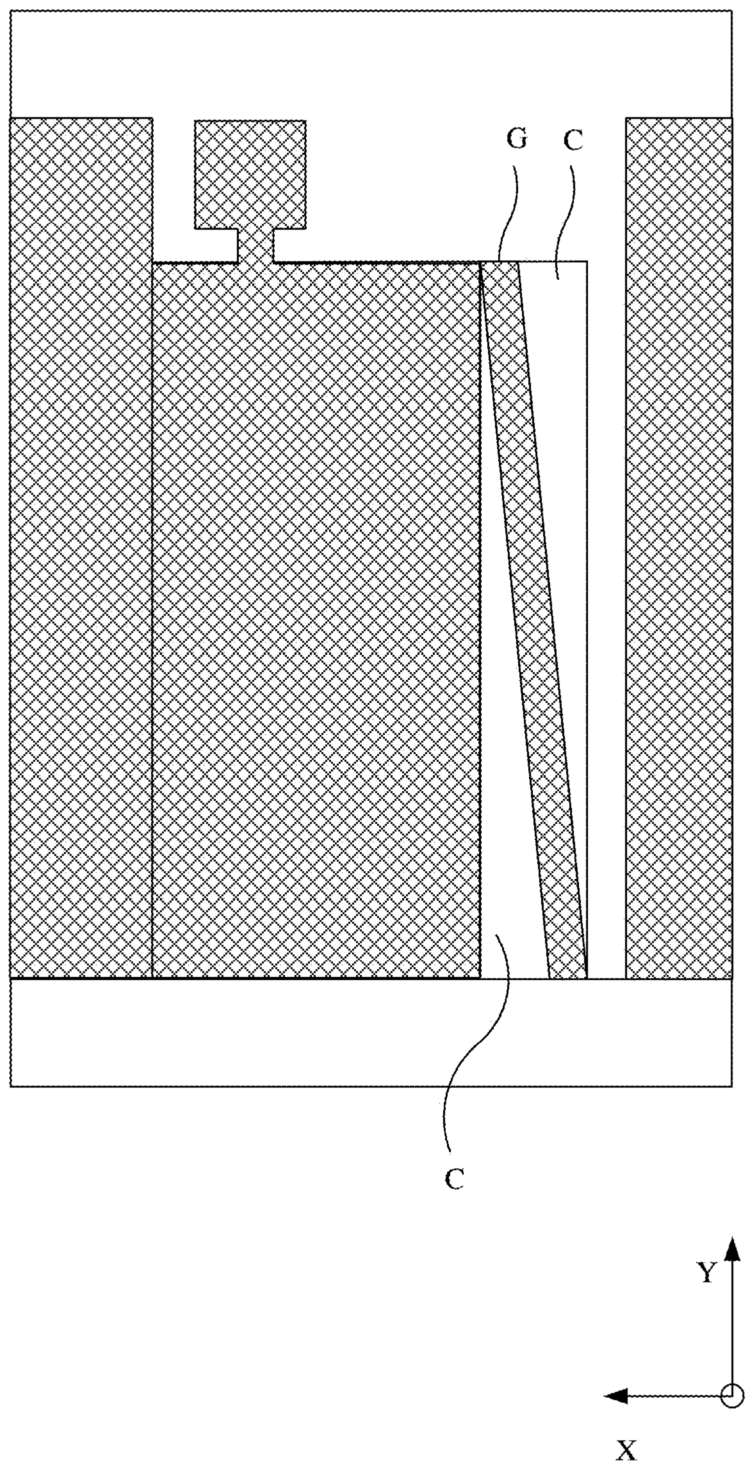
Figure 16D:
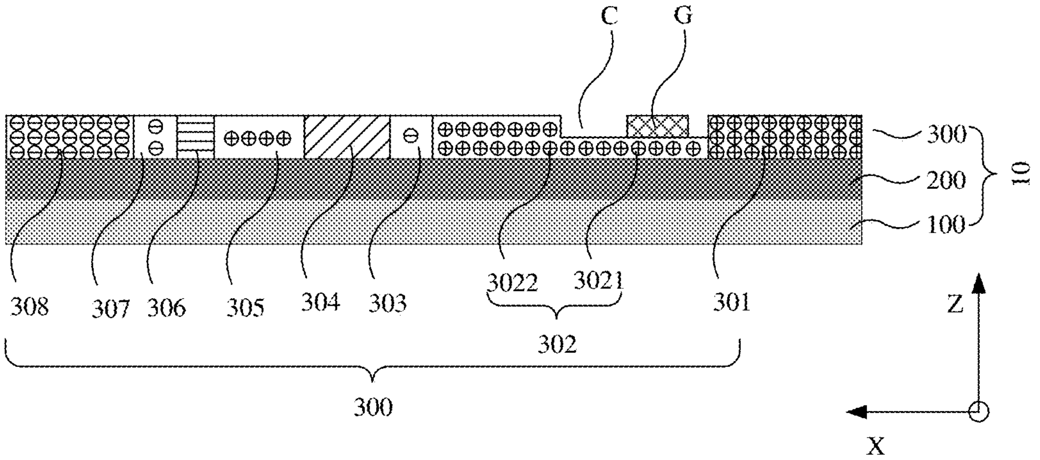
Figure 16E:
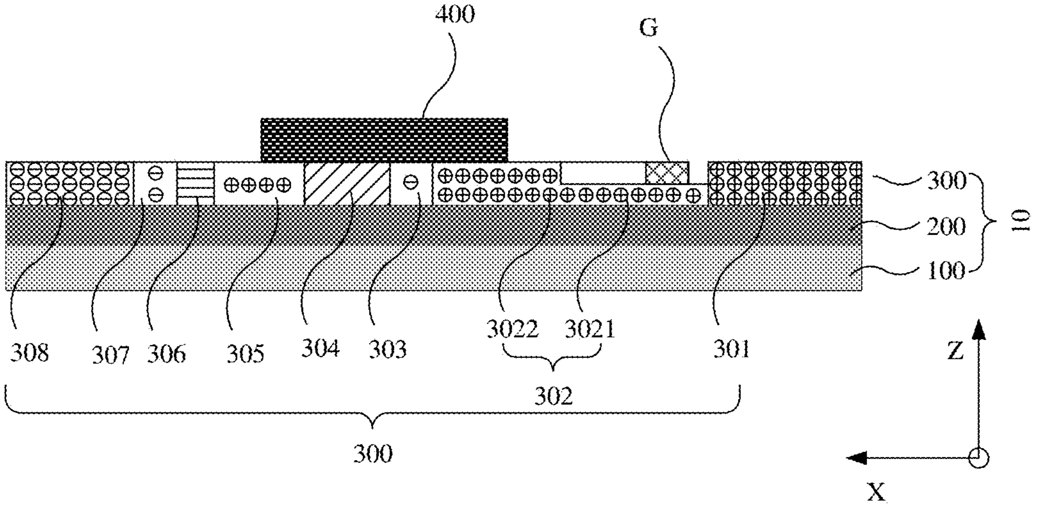
Figure 16F:
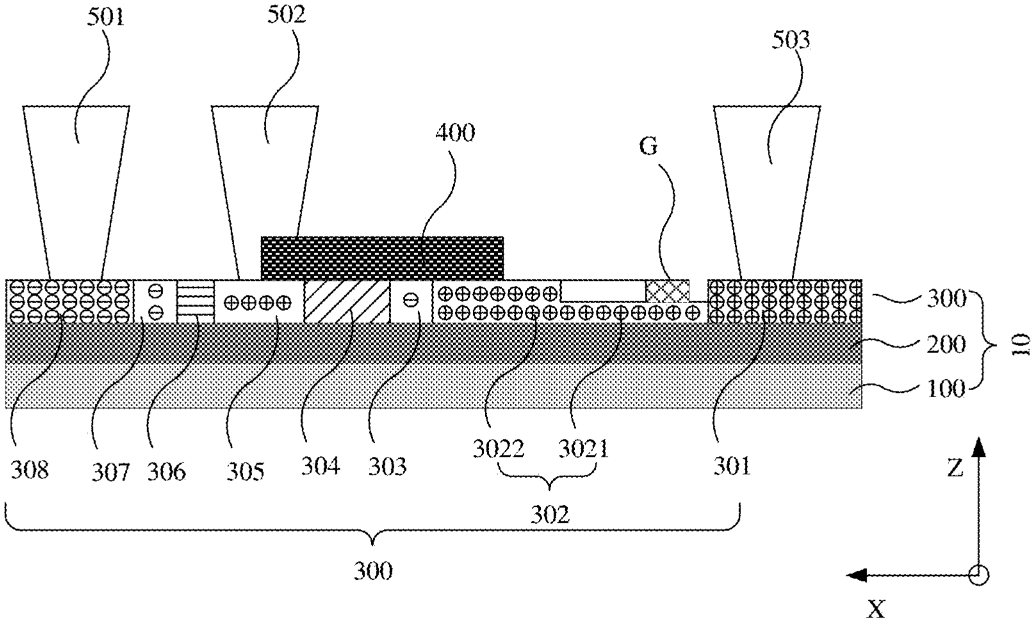
Figure 16G:
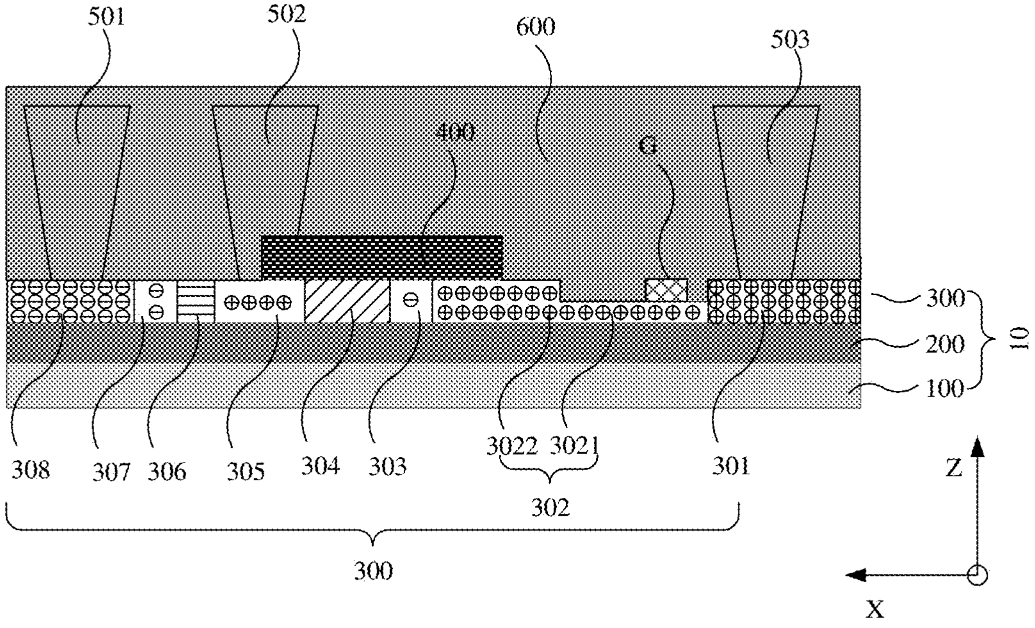

The avalanche photodetector of the disclosure may further include a cover layer covering the first semiconductor layer 300, the second semiconductor layer 400, the first electrode 501, the second electrode 502, and the third electrode 503 (as illustrated in FIG. 15E or FIG. 16G).

It should be noted that the structure of the avalanche photodetector of the disclosure may also be its own mirror structure. For example, referring to FIG. 3, the first direction X in the embodiments of the disclosure is from right to left, and a first direction X' of the mirror structure is from left to right. Therefore, the avalanche photodetector provided by the embodiments of the disclosure and the mirror structure thereof are both within the scope of protection of the disclosure.

The avalanche photodetector provided by the embodiments of the disclosure includes: a substrate and a second semiconductor layer. A surface of the substrate includes a first semiconductor layer. The second semiconductor layer is located on the first semiconductor layer, and a material of the second semiconductor layer is different from a material of the first semiconductor layer. Here, the first semiconductor layer includes a first P-type doped region, a second P-type doped region, a third N-type doped region, a first intrinsic region, a third P-type doped region, a second intrinsic region, a second N-type doped region, and a first N-type doped region arranged sequentially along a first direction. Dopant concentration decrease sequentially from the first P-type doped region to the third P-type doped region, and dopant concentrations decrease sequentially from the first N-type doped region to the third N-type doped region. The first direction is a flow direction of electrons of the avalanche photodetector. The second semiconductor layer covers a portion of the second P-type doped region, the third N-type doped region, the first intrinsic region, and a portion of the third P-type doped region sequentially along the first direction. The first N-type doped region is connected to a first electrode, the third P-type doped region is connected to a second electrode, and the first P-type doped region is connected to a third electrode. Since multiple doped charge regions and the second intrinsic region as the avalanche region are all provided in the first semiconductor layer, there is no need for additional epistaxis to fabricate monocrystalline silicon, and the fabrication is relatively simple, which is beneficial to reducing the cos. Further, since the first N-type doped region is connected with the first electrode, the third P-type doped region is connected with the second electrode, and the first P-type doped region is connected with the third electrode, bias voltages may be applied to the three electrodes independently; thus electric fields in the second semiconductor layer as the absorption region and the second intrinsic region as the avalanche region may be independently adjusted, and a tolerance for the concentration accuracy of doped regions is better, which is beneficial to realizing low noise and high gain bandwidth.

Figure 14:
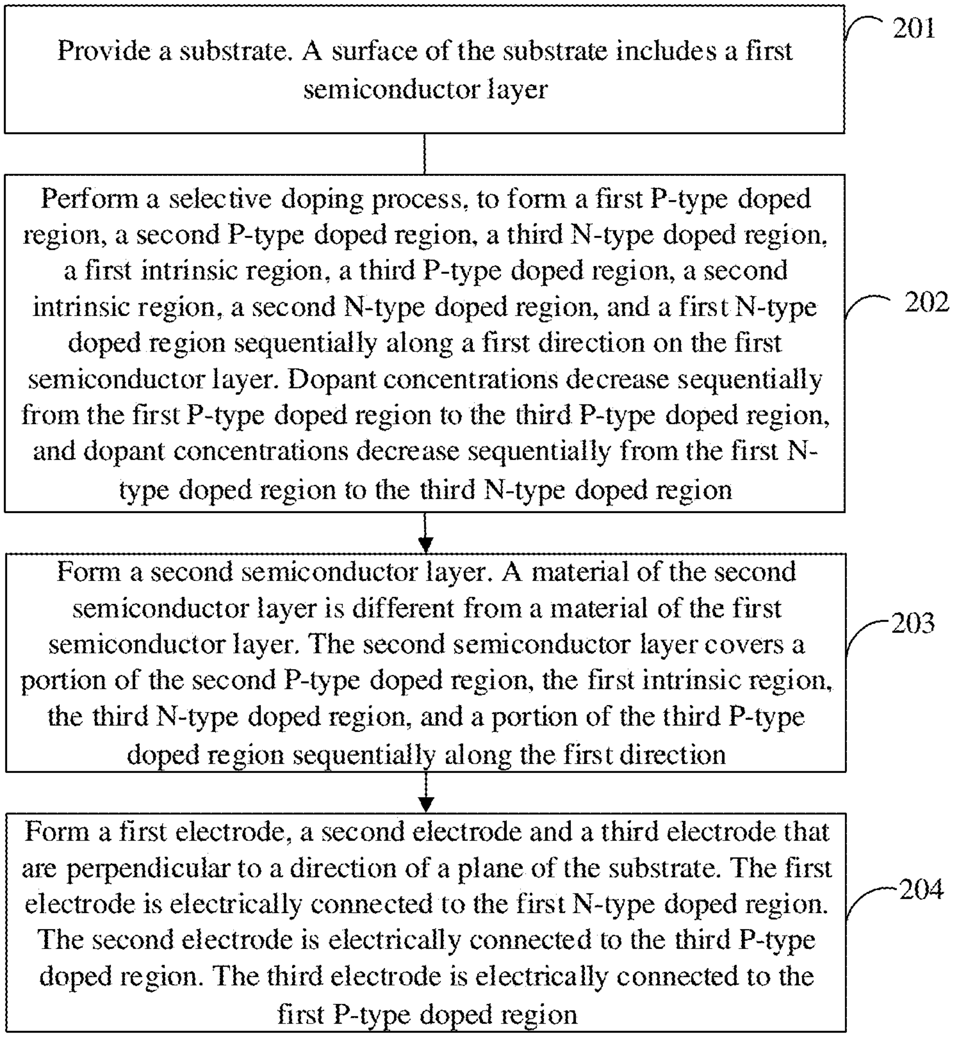
FIG. 14 illustrates a schematic flowchart of a method for preparing an avalanche photodetector according to embodiments of the disclosure.

Embodiments of the disclosure further provide a method for preparing an avalanche photodetector. As illustrated in FIG. 14, the method includes the following operations 201 to 204.

At 201, a substrate is provided. A surface of the substrate includes a first semiconductor layer.

At 202, a selective doping process is performed, to form a first P-type doped region, a second P-type doped region, a third N-type doped region, a first intrinsic region, a third P-type doped region, a second intrinsic region, a second N-type doped region, and a first N-type doped region sequentially along a first direction on the first semiconductor layer.

At 203, a second semiconductor layer is formed. A material of the second semiconductor layer is different from a material of the first semiconductor layer. The second semiconductor layer covers a portion of the second P-type doped region, the third N-type doped region, the first intrinsic region, and a portion of the third P-type doped region sequentially along the first direction.

At 204, a first electrode, a second electrode and a third electrode that are perpendicular to a direction of a plane of the substrate are formed. The first electrode is electrically connected to the first N-type doped region. The second electrode is electrically connected to the third P-type doped region. The third electrode is electrically connected to the first P-type doped region.

The first direction above is a flow direction of electrons of the avalanche photodetector.

FIGS. 15A to 15E illustrate cutaway views of component structures of an avalanche photodetector during preparation according to embodiments of the disclosure; and FIGS. 16A to 16G illustrate cutaway views of component structures of another avalanche photodetector during preparation according to embodiments of the disclosure.

Hereinafter, the avalanche photodetector and the method for preparing same according to the embodiments of the disclosure are described in further detail with reference to the cutaway views of component structures of the avalanche photodetector during preparation in FIGS. 15A to 15E.

Firstly, operation 201 is performed. A substrate is provided, and the substrate includes the first semiconductor layer.

Please refer to FIG. 15A, a substrate 10 is provided; the substrate 10 may include a multilayer structure, with functional layers further grown on the multilayer structure. Therefore, the substrate 10 of the disclosure may include the multilayer structure. A surface of the substrate 10 includes a first semiconductor layer 300, and a layer below the surface may include an insulating layer composed of a monoatomic semiconductor material (e.g., Si, and Ge), a composite semiconductor material (e.g., SiGe), and oxides thereof, and thus the substrate 10 may be SOI, GeOI, or the like.

The embodiments of the disclosure are described with the substrate 10 being SOI as an example. It may be understood that the first semiconductor layer 300 is located at the surface of the substrate 10 of the disclosure.

The substrate 10 further includes an intermediate layer 200 (which may be an insulating layer in practical applications) and a bottom layer 100 (which may be a Si layer in practical applications) that are located under the first semiconductor layer 300. The insulating layer 200, for example, is a silicon dioxide layer, which may be obtained directly by thermally oxidating the bottom layer 100. The bottom layer 100 may have a greater thickness than the first semiconductor layer 300.

Next, operation 202 is performed. Please refer to FIG. 15B. The selective doping process is performed, to form the first P-type doped region 301, the second P-type doped region 302, the third N-type doped region 303, the first intrinsic region 304, the third P-type doped region 305, the second intrinsic region 306, the second N-type doped region 307, and a first N-type doped region 308 sequentially along the first direction on the first semiconductor layer.

In practical processes, a mask plate lithography process may be to sequentially windowing for regions that need to be doped. Subsequently, ion implantation is performed in the windows, to form the above doped regions with different dopant concentrations.

Specifically, a dopant concentration in the first P-type doped region or the first N-type doped region is $1\times10^{20}/cm^3\sim5\times10^{20}/cm^3$, a dopant concentration in the second P-type doped region or the second N-type doped region is $2\times10^{17}/cm^3\sim5\times10^{18}/cm^3$, and a dopant concentration in the third P-type doped region or the third N-type doped region is $1.2\times10^{17}\sim4\times10^{17}/cm^3$. In some embodiments, a dopant in the first P-type doped region 301, the second P-type doped region 302, and the third P-type doped region 305 is boron (B); and a dopant of the first N-type doped region 308, the second N-type doped region 307, and the third N-type doped region 303 is the phosphorus (P) element or the arsenic (As) element.

In some embodiments, the method further includes the following operation.

Before performing the selective doping process, in zones where a portion of the second P-type doped region, a portion of the third P-type doped region, the first intrinsic region and the third N-type doped region are to be formed, in a direction perpendicular to the substrate, a height different from a height of remaining zones in the first semiconductor layer in the direction perpendicular to the substrate is formed.

In some embodiments, the operation that before performing the selective doping process, in the zones where the portion of the second P-type doped region, the portion of the third P-type doped region, the first intrinsic region and the third N-type doped region are to be formed, in the direction perpendicular to the substrate, the height different from the height of the remaining zones in the first semiconductor layer in the direction perpendicular to the substrate is formed includes the following operation.

In the zones where the portion of the second P-type doped region, the portion of the third P-type doped region, the first intrinsic region and the third N-type doped region are to be formed, in the direction perpendicular to the substrate, a height $H_1$ greater than a height $H_2$ of the remaining zones in the first semiconductor layer in the direction perpendicular to the substrate is formed.

In other embodiments, the operation that before performing the selective doping process, in the zones where the portion of the second P-type doped region, the portion of the third P-type doped region, the first intrinsic region and the third N-type doped region are to be formed, in the direction perpendicular to the substrate, the height different from the height of the remaining zones in the first semiconductor layer in the direction perpendicular to the substrate is formed includes the following operation.

In the zones where the portion of the second P-type doped region, the portion of the third P-type doped region, the first intrinsic region and the third N-type doped region are to be formed, in the direction perpendicular to the substrate, a height $H_1$ smaller than a height $H_2$ of the remaining zones in the first semiconductor layer in the direction perpendicular to the substrate is formed.

Here, in the two embodiments above, the portion of the second P-type doped region, the portion of the third P-type doped region, the first intrinsic region and the third N-type doped region in the first semiconductor layer in the avalanche photodetector have the height different from the height of the remaining zones in the first semiconductor layer in the direction perpendicular to the substrate; therefore, the height of the second semiconductor layer covering the portion of the second P-type doped region, the portion of the third P-type doped region, the first intrinsic region, and the third N-type doped region is also correspondingly different in the two embodiments. In addition to this, other parts of the two avalanche photodetectors are same. Therefore, the method for preparing the avalanche photodetector provided in the embodiments of the disclosure will be described herein with an example that the height $H_1$ of the portion of the second P-type doped region, the portion of the third P-type doped region, the first intrinsic region and the third N-type doped region in the first semiconductor layer in the direction perpendicular to the substrate is greater than the height $H_2$ of the remaining zones in the first semiconductor layer.

Here, before performing the selective doping process, in the zones where the portion of the second P-type doped region 302, the portion of the third P-type doped region 303, the first intrinsic region 304 and the third N-type doped region 303 are to be formed, in the direction (direction Z) perpendicular to the substrate the height different from the height of the remaining zones in the first semiconductor layer 300 is formed. In practical applications, different heights of different zones may be realized by using a process combination of lithography, etching, etc. The method includes that in the zones where the portion of the second P-type doped region 302, the portion of the third P-type doped region 305, the first intrinsic region 304 and the third N-type doped region 303 are to be formed, in the direction perpendicular to the substrate, the height $H_1$ greater than the height $H_2$ of the remaining zones in the first semiconductor layer is formed.

Next, operation 203 is performed. Please refer to FIG. 15C, a second semiconductor layer 400 is formed. The second semiconductor layer 400 covers the first intrinsic region 304 and the third N-type doped region 303, and covers a portion of the second P-type doped region 302, and a portion of the third P-type doped region 305 in the first direction X.

In some embodiments, an initial second semiconductor layer 400' (not shown in FIG. 15C) covering the first semiconductor material 300 is firstly formed, then a patterned photoresist layer is used to etch the initial second semiconductor layer 400' to form the second semiconductor layer 400. Then the photoresist layer is removed.

Here, a shape of the second semiconductor layer 400 formed is rectangular (the second semiconductor layer 400 in FIG. 4 may be referred to for the shape), or may be a trapezoidal (the second semiconductor layer 400 in FIG. 1 may be referred to for the shape).

In some embodiments, a material of the first semiconductor layer is different from a material of the second semiconductor layer. For example, in a case where the material of the first semiconductor layer is Si, the material of the second semiconductor layer is one of Ge, SiGe alloy, a III-V group material and an alloy of the III-V group material.

In a specific embodiment of the avalanche photodetector according to the embodiments of the disclosure, the material of the first semiconductor layer is Si, and the material of the second semiconductor layer is Ge. In other words, the avalanche photodetector according to the embodiments of the disclosure is a SiGe avalanche photodetector.

Processes such as molecular beam epistaxis may be used to grow high-quality polycrystalline germanium materials by epistaxis, that is, forming the second semiconductor layer.

Next, operation 204 is performed. Please refer to FIG. 15D. A first electrode 501, a second electrode 502 and a third electrode 503 that are perpendicular to the direction of the plane of the substrate are formed. The first electrode 501 is electrically connected to the first N-type doped region 308. The second electrode 502 is electrically connected to the third P-type doped region 305. The third electrode 503 is electrically connected to the first P-type doped region 301.

In some embodiments, the operation that the first electrode 501, the second electrode 502 and the third electrode 503 that are perpendicular to the direction of the plane of the substrate are formed includes the following operations.

A cover layer 600 covering the first semiconductor layer 300 and the second semiconductor layer 400 is formed.

A first window, a second window and a third window are formed above the first N-type doped region 308, the third P-type doped region 305, and the first P-type doped region 301 respectively.

The first window, the second window and the third window are filled with metal, to form the first electrode 501, the second electrode 502 and the third electrode 503 respectively.

In an embodiment, the cover layer 600 may be formed directly by an insulating material. Referring to FIG. 15E, firstly, the insulating material, such as Si dioxide, may be used to form the cover layer 600, to cover the doped first semiconductor layer 300 and the doped second semiconductor layer 400. Then, photolithography and inductively coupling plasma etching are used to perform windowing on the cover layer 600, to form the first window, the second window and the third window to expose surfaces of the first N-type doped region 308, the third P-type doped region 305 and the first P-type doped region 301 in the first semiconductor layer 300. Next, metal materials are deposited in the first window, the second window and the third window by using for example a magnetron sputtering process, to form the first electrode 501, the second electrode 502 and the third electrode 503 that are electrically connected to the first N-type doped region 308, the third P-type doped region 305 and the first P-type doped region 301 respectively.

After the electrodes are formed, an upper surface of the cover layer 600 may further be flattened, which may be realized by a chemical mechanical polishing (CMP) process. In this way, different voltages may be applied between the first electrode 501 and the second electrode 502, and may be applied between the first electrode 501 and the third electrode 503 through external leads, to provide a bias voltage between the first electrode 501 and the second electrode 502 and a bias voltage between the first electrode 501 and the third electrode 503.

Hereinafter, the avalanche photodetector and the method for preparing same provided in the embodiments of the disclosure are further explained with reference to the cutaway views of component structures of the avalanche photodetector during preparation in FIGS. 16A to 16G.

Firstly, operation 201 is performed.

As illustrated in FIG. 16A, a substrate is provided. The substrate includes a first semiconductor layer.

Next, two wedge-shaped grooves C are formed on zones where a portion of the second P-type doped region adjacent to the first P-type doped region is to be formed, referring to FIGS. 16B and 16C. Therefore, a portion of the first semiconductor layer G between the two wedge-shaped grooves C is reserved, and the portion of the first semiconductor layer G reserved is not doped or lightly doped. Here, this portion of the first semiconductor layer G is not doped or lightly doped in order that this portion of the first semiconductor layer G acts as an optical waveguide in the formed photodetector to transmit the energy of light to subsequent portions.

In practical processes, the two wedge-shaped grooves C above may be formed by mask plate combined with etching, thus forming the portion of the first semiconductor layer G between the two wedge-shaped grooves C.

Next, operation 202 is performed. Please refer to FIG. 16D. A selective doping process is performed, to form a first P-type doped region 301, a second P-type doped region 302, a third N-type doped region 303, a first intrinsic region 304, a third P-type doped region 305, a second intrinsic region 306, a second N-type doped region 307, and a first N-type doped region 308 sequentially along a first direction on the first semiconductor layer 300.

As described above, the portion of the first semiconductor layer G reserved between the two wedge-shaped grooves C is not doped or lightly doped. In practical processes, a mask lithography process may be used to perform windowing for regions that need to be doped subsequently. Subsequently, ion implantation is performed in windows to form doped regions with different dopant concentrations. By utilizing appropriate ion implantation process, the portion of the first semiconductor layer G is undoped or lightly doped.

Next, operation 203 is performed. Please, refer to FIG. 16E, a second semiconductor layer 400 is formed, and the second semiconductor layer 400 covers the first intrinsic region 304 and the third N-type doped region 303 in a first direction X, also covers a portion of the second P-type doped region 302 and a portion of the third P-type doped region 305 in the first direction X.

Next, operation 204 is performed. Please refer to FIG. 16F. A first electrode 501, a second electrode 502 and a third electrode 503 that are perpendicular to a direction of a plane of the substrate are formed. The first electrode 501 is electrically connected to the first N-type doped region 308. The second electrode 502 is electrically connected to the third P-type doped region 305. The third electrode 503 is electrically connected to the first P-type doped region 301.

In some embodiments, as illustrated in FIG. 16G, the operation that the first electrode 501, the second electrode 502 and the third electrode 503 that are perpendicular to the direction of the plane of the substrate are formed includes the following operations.

A cover layer 600 covering the first semiconductor layer 300 and the second semiconductor layer 400 is formed.

A first window, a second window and a third window are formed above the first N-type doped region 308, the third P-type doped region 305 and the first N-type doped region 308 respectively.

The first window, the second window and the third window are filled with a metal material, to form the first electrode 501, the second electrode 502 and the third electrode 503 respectively.

It should be noted that in the above-described method illustrated in FIGS. 16A to 16G, parts similar to the method in FIGS. 15A to 15E are not repeated.

It should be noted that the embodiments of the avalanche photodetector provided in the disclosure belongs to a same concept as the embodiments of the method for manufacturing the avalanche photodetector. Technical features in the technical solution described in various embodiments may be arbitrarily combined without conflict. However, it should be further noted that the combination of technical features of the avalanche photodetector provided in the embodiment of the disclosure can already solve the technical problems to be solved by the disclosure; therefore, the avalanche photodetector provided in the embodiments of the disclosure may not be limited by the method for manufacturing the avalanche photodetector provided in the embodiments of the disclosure, and avalanche photodetectors prepared by any preparation method capable of forming the avalanche photodetector provided in the embodiments of the disclosure are within the scope of protection of the disclosure.

The above are only preferred embodiments of the disclosure, and are not intended to limit the scope of protection of the disclosure. Any modification, equivalent replacement and improvement made within the spirit and principles of the disclosure should be included within the scope of protection of the disclosure.

The invention claimed is:

1. An avalanche photodetector, comprising:

a substrate, a surface of the substrate comprising a first semiconductor layer; and a second semiconductor layer on the first semiconductor layer, a material of the second semiconductor layer being different from a material of the first semiconductor layer;

wherein the first semiconductor layer comprises a first P-type doped region, a second P-type doped region, a third N-type doped region, a first intrinsic region, a third P-type doped region, a second intrinsic region, a second N-type doped region, and a first N-type doped region arranged sequentially along a first direction, dopant concentrations decrease sequentially from the first P-type doped region to the third P-type doped region, dopant concentrations decrease sequentially from the first N-type doped region to the third N-type doped region, and the first direction is a flow direction of electrons of the avalanche photodetector;

wherein the second semiconductor layer covers a portion of the second P-type doped region, the third N-type doped region, the first intrinsic region, and a portion of the third P-type doped region sequentially along the first direction;

wherein the first N-type doped region is connected to a first electrode; the third P-type doped region is connected to a second electrode; and the first P-type doped region is connected to a third electrode.

2. The avalanche photodetector of claim 1, wherein the first intrinsic region, the third N-type doped region, a portion of the second P-type doped region adjacent to the third N-type doped region, and a portion of the third P-type doped region adjacent to the first intrinsic region in the first semiconductor layer have a first height $H_1$ in a direction perpendicular to the substrate, and remaining zones in the first semiconductor layer have a second height $H_2$; and $H_1$ is not equal to $H_2$; and the second semiconductor layer covers a portion of a zone of the second P-type doped region with the second height $H_2$, a zone of the second P-type doped region with the first height $H_1$, the third N-type doped region, the first intrinsic region, a zone of the third P-type doped region with the first height $H_1$, and a portion of a zone of the third P-type doped region with the second height $H_2$ sequentially along the first direction.

3. The avalanche photodetector of claim 2, wherein $H_1$ is greater than $H_2$.

4. The avalanche photodetector of claim 2, wherein $H_1$ is smaller than $H_2$.

5. The avalanche photodetector of claim 1, further comprising:

an optical waveguide located on the first semiconductor layer, and comprising a front end close to a light incidence end and a tail end away from the light incidence end;

wherein a third height $H_3$ of a portion of the second P-type doped region adjacent to the first P-type doped region in the first semiconductor layer is smaller than a fourth height $H_4$ of remaining zones in the first semiconductor layer, to form a groove extending along a second direction, and the second direction is perpendicular to the first direction and is parallel to the surface of the substrate;

the second semiconductor layer covers a portion of a zone the second P-type doped region with the fourth height $H_4$, the third N-type doped region, the first intrinsic region, and a portion of the third P-type doped region sequentially along the first direction; and the optical waveguide is located in the groove, and is arranged to extend roughly along the second direction and form a predetermined included angle with the second direction, to enable the front end to be close to the first P-type doped region and to enable the tail end to be close to the zone of the second P-type doped region with the fourth height $H_4$.

6. The avalanche photodetector of claim 5, wherein the optical waveguide is undoped or lightly doped.

7. The avalanche photodetector of claim 1, wherein a first reverse bias voltage $V_1$ is set between the first electrode and the third electrode, and a second reverse bias voltage $V_2$ is set between the first electrode and the second electrode.

8. The avalanche photodetector of claim 1, wherein the material of the first semiconductor layer is silicon, and the material of the second semiconductor layer is one of germanium, germanium silicon alloy, a III-V group material, or an alloy of the III-V group material.

9. The avalanche photodetector of claim 1, wherein a dopant concentration in the first P-type doped region or the first N-type doped region is $1\times10^{20}/cm^3\sim5\times10^{20}/cm^3$, a dopant concentration in the second P-type doped region or the second N-type doped region is $2\times10^{17}/cm^3\sim5\times10^{18}/cm^3$, and a dopant concentration in the third P-type doped region or the third N-type doped region is $1.2\times10^{17}\sim4\times10^{17}/cm^3$.

10. The avalanche photodetector of claim 1, wherein a size of the second intrinsic region in the first direction is 50 nm to 800 nm.

11. The avalanche photodetector of claim 1, wherein a size of the second semiconductor layer in the first direction is 150 nm to 1500 nm, a size of the second semiconductor layer in a second direction is 1 μm to 100 μm, and a size of the second semiconductor layer in a third direction is 150 nm to 600 nm, wherein the third direction is perpendicular to the substrate, and the second direction is perpendicular to the third direction and is perpendicular to the first direction.

12. A method for preparing an avalanche photodetector, comprising:

providing a substrate, a surface of the substrate comprising a first semiconductor layer;

performing a selective doping process, to form a first P-type doped region, a second P-type doped region, a third N-type doped region, a first intrinsic region, a third P-type doped region, a second intrinsic region, a second N-type doped region, and a first N-type doped region sequentially along a first direction on the first semiconductor layer, wherein dopant concentrations decrease sequentially from the first P-type doped region to the third P-type doped region, and dopant concentrations decrease sequentially from the first N-type doped region to the third N-type doped region;

forming a second semiconductor layer, wherein a material of the second semiconductor layer is different from a material of the first semiconductor layer, and the second semiconductor layer covers a portion of the second P-type doped region, the third N-type doped region, the first intrinsic region, and a portion of the third P-type doped region sequentially along the first direction; and forming a first electrode, a second electrode and a third electrode that are perpendicular to a direction of a plane of the substrate, the first electrode being electrically connected to the first N-type doped region; the second electrode being electrically connected to the third P-type doped region; and the third electrode being electrically connected to the first P-type doped region;

wherein the first direction is a flow direction of electrons of the avalanche photodetector.

13. The method of claim 12, further comprising:

before performing the selective doping process, forming, in a direction perpendicular to the substrate in zones where a portion of the second P-type doped region, a portion of the third P-type doped region, the first intrinsic region and the third N-type doped region are to be formed, a height different from a height of remaining zones in the first semiconductor layer in the direction perpendicular to the substrate.

14. The method of claim 13, wherein before performing the selective doping process, forming, in the direction perpendicular to the substrate in the zones where the portion of the second P-type doped region, the portion of the third P-type doped region, the first intrinsic region and the third N-type doped region are to be formed, the height different from the height of the remaining zones in the first semiconductor layer in the direction perpendicular to the substrate comprises:

forming, in the direction perpendicular to the substrate in the zones where the portion of the second P-type doped region, the portion of the third P-type doped region, the first intrinsic region and the third N-type doped region are to be formed, a height $H_1$ greater than a height $H_2$ of the remaining zones in the first semiconductor layer in the direction perpendicular to the substrate.

15. The method of claim 13, wherein before performing the selective doping process, forming, in the direction perpendicular to the substrate in the zones where the portion of the second P-type doped region, the portion of the third P-type doped region, the first intrinsic region and the third N-type doped region are to be formed, the height different from the height of the remaining zones in the first semiconductor layer in the direction perpendicular to the substrate comprises:

forming, in the direction perpendicular to the substrate in the zones where the portion of the second P-type doped region, the portion of the third P-type doped region, the first intrinsic region and the third N-type doped region are to be formed, a height $H_1$ smaller than a height $H_2$ of the remaining zones in the first semiconductor layer in the direction perpendicular to the substrate.

16. The method of claim 12, further comprising:

before performing the selective doping process, forming two wedge-shaped grooves on zones where a portion of the second P-type doped region adjacent to the first P-type doped region is to be formed, to reserve a portion of the first semiconductor layer between the two wedge-shaped grooves.

17. The method of claim 16, wherein the portion of the first semiconductor layer reserved is undoped or lightly doped.

18. The method of claim 12, wherein the material of the first semiconductor layer is silicon, and the material of the second semiconductor layer is one of germanium, germanium silicon alloy, a III-V group material or an alloy of the III-V group material.

19. The method of claim 12, wherein a dopant concentration in the first P-type doped region or the first N-type doped region is $1\times10^{20}/cm^3$~$5\times10^{20}/cm^3$, a dopant concentration in the second P-type doped region or the second N-type doped region is $2\times10^{17}/cm^3$~$5\times10^{18}/cm^3$, and a dopant concentration in the third P-type doped region or the third N-type doped region is $1.2\times10^{17}$~$4\times10^{17}/cm^3$.

20. The method of claim 12, wherein forming the first electrode, the second electrode and the third electrode that are perpendicular to the direction of the plane of the substrate comprises:

forming a cover layer covering the first semiconductor layer and the second semiconductor layer;

forming a first window, a second window and a third window at an end of the first N-type doped region, an end of the third P-type doped region and an end of the first P-type doped region respectively along a second direction, to expose partial surfaces of the first P-type doped region, the third P-type doped region and the first N-type doped region, wherein the second direction is perpendicular to the first direction and being parallel to the substrate; and filling the first window, the second window and the third window with metal, to form the first electrode, the second electrode and the third electrode.

* * * * *